(12) United States Patent
Leung et al.

(10) Patent No.: US 8,634,512 B2
(45) Date of Patent: Jan. 21, 2014

(54) TWO POINT MODULATION DIGITAL PHASE LOCKED LOOP

(75) Inventors: Lai Kan Leung, San Diego, CA (US); Chiewcharn Narathong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 348 days.

(21) Appl. No.: 13/023,369

(22) Filed: Feb. 8, 2011

(65) Prior Publication Data
US 2012/0201338 A1 Aug. 9, 2012

(51) Int. Cl.
*H03D 3/24* (2006.01)

(52) U.S. Cl.
USPC .......... 375/376; 375/215; 375/294; 375/327; 375/371; 375/373; 327/156

(58) Field of Classification Search
USPC ......... 375/215, 286, 294, 316, 327, 354, 371, 375/373, 375, 376
See application file for complete search history.

(56) References Cited

U.S. PATENT DOCUMENTS

| | | | |
|---|---|---|---|
| 6,515,553 B1 | 2/2003 | Filiol et al. | |
| 6,933,798 B2 | 8/2005 | Hammes et al. | |
| 7,502,435 B2 * | 3/2009 | Hammes | 375/376 |
| 7,579,919 B1 * | 8/2009 | Cao | 331/176 |
| 7,612,617 B2 | 11/2009 | Pullela et al. | |
| 8,045,670 B2 * | 10/2011 | Waheed et al. | 375/376 |
| 8,437,442 B2 * | 5/2013 | Grewing et al. | 375/376 |
| 2003/0043950 A1 * | 3/2003 | Hansen et al. | 375/376 |
| 2004/0192231 A1 * | 9/2004 | Grewing et al. | 455/102 |
| 2009/0251225 A1 * | 10/2009 | Chen et al. | 331/1 A |
| 2009/0256601 A1 * | 10/2009 | Zhang et al. | 327/156 |
| 2009/0275358 A1 * | 11/2009 | Feltgen et al. | 455/550.1 |
| 2009/0278613 A1 * | 11/2009 | Jensen et al. | 331/16 |
| 2009/0302951 A1 * | 12/2009 | Ballantyne | 331/16 |
| 2009/0322439 A1 * | 12/2009 | Mayer et al. | 332/118 |
| 2010/0141313 A1 * | 6/2010 | Geng et al. | 327/159 |
| 2010/0272222 A1 * | 10/2010 | Mitani et al. | 375/376 |
| 2010/0310031 A1 | 12/2010 | Ballantyne et al. | |
| 2011/0133799 A1 * | 6/2011 | Dunworth et al. | 327/157 |

FOREIGN PATENT DOCUMENTS

WO WO2004034564 A2 4/2004
WO WO2011071953 6/2011

OTHER PUBLICATIONS

Sungho Lee, Self-Calibrated Two Point Delta sigma modulation for RF transmitters, IEEE transactions on microwave theory, Jul. 2010.*
U.S. Appl. No. 12/632,053, filed Dec. 7, 2009, Dunworth et al.
U.S. Appl. No. 12/432,468, filed Apr. 29, 2009, Geng et al.
U.S. Appl. No. 12/102,768, filed Apr. 14, 2008, Zhang et al.

(Continued)

*Primary Examiner* — Hirdepal Singh
(74) *Attorney, Agent, or Firm* — Ramin Mobarhan

(57) ABSTRACT

A two point modulation digital phase locked loop circuit is disclosed. The circuit includes a sampling clock input that is switchable between a plurality of frequencies. The circuit also includes a sigma-delta modulator in a feedback path that receives low-pass modulation data. The circuit also includes a voltage-mode digital-to-analog converter (VDAC) that receives high-pass modulation data. The circuit also includes an analog voltage controlled oscillator coupled to the feedback path and the output of the VDAC. The circuit also includes a phase-to-digital converter (PDC) coupled to the feedback path, the sampling clock and a loop filter.

38 Claims, 15 Drawing Sheets

(56) References Cited

OTHER PUBLICATIONS

Straayer et al., "A Multi-Path Gated Ring Oscillator TDC With First-Order Noise Shaping," IEEE J. Solid-State Circuits, vol. 44, pp. 1089-1098, Apr. 2009.

Zanuso, et al., "A 3MHz-BW 3.6GHz Digital Fractional-N PLL With Sub-Gate-Delay TDC, Phase-Interpolation Divider, and Digital Mismatch Cancellation," Dig. technical papers, IEEE Solid-State Circuits Conference (ISSCC), pp. 476-477, 2010.

Chen et al., "A Calibration-Free 800MHz Fractional-N Digital PLL With Embedded TDC," Dig. technical papers, IEEE Solid-State Circuits Conference (ISSCC), pp. 472-473, 2010.

Borremans et al., "A 86MHz-to-12GHz Digital-Intensive Phase-Modulated Fractional-N PLL Using A 15pJ/Shot 5ps TDC in 40nm Digital CMOS," Dig. technical papers, IEEE Solid-State Circuits Conference (ISSCC), pp. 480-481, 2010.

International Search Report and Written Opinion—PCT/US2012/024308—ISA/EPO—May 14, 2012.

\* cited by examiner

US 8,634,512 B2

TWO POINT MODULATION DIGITAL PHASE LOCKED LOOP

TECHNICAL FIELD

The present disclosure relates generally to communication systems. More specifically, the present disclosure relates to a two point modulation digital phase locked loop.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple wireless communication devices with one or more base stations.

Mobile devices may include a variety of circuits used during operation. For example, an oscillator may be used to synchronize various circuits across a board or integrated circuit within a mobile device. Furthermore, different circuits within a mobile device may operate using different frequencies. Therefore, mobile devices may generate multiple reference signals for different purposes.

However, like other portable electronic devices, mobile devices may have limited battery life. Along with other types of circuits, oscillators consume current during operation, thus shortening battery life. Furthermore, it may be desirable to minimize the amount of noise in reference signals. Therefore, benefits may be realized by a two point modulation digital phase locked loop.

SUMMARY OF THE INVENTION

A two point modulation digital phase locked loop circuit is disclosed. The circuit includes a sampling clock input that is switchable between a plurality of frequencies. The circuit also includes a sigma-delta modulator in a feedback path that receives low-pass modulation data. The circuit also includes a voltage-mode digital-to-analog converter (VDAC) that receives high-pass modulation data. The circuit also includes an analog voltage controlled oscillator coupled to the feedback path and the output of the VDAC. The circuit also includes a phase-to-digital converter (PDC) coupled to the feedback path, the sampling clock and a loop filter.

The high-pass modulation data may include modulation data that is scaled with an adaptive high-pass gain and a high-pass gain resolution adjustment. The low-pass modulation data may include modulation data that is scaled with a variable low-pass gain that is based on the sampling clock frequency and summed with a frequency control word for the sigma-delta modulator.

The circuit may also include a $K_v$ adaptation module configured to determine the adaptive high-pass gain. The $K_v$ adaptation module may be further configured to receive a phase error between the sampling clock and the feedback path that has been filtered by the loop filter. The $K_v$ adaptation module may be further configured to multiply the filtered phase error by an inverse bandwidth coefficient to produce a first signal, to multiply the first signal by a sign bit of the modulation data to produce a second signal, to sum the second signal with a previous second signal to produce a third signal and to multiply the third signal by a bandwidth coefficient to produce the high-pass gain.

All digital modules in the digital phase locked loop may use the sampling clock input as an operation clock. These digital modules may include the sigma-delta modulator, the phase-to-digital converter and the loop filter. The high-pass modulation data may be summed with the output of the loop filter before it is input to the voltage-mode digital-to-analog converter (VDAC). The voltage-mode digital-to-analog converter (VDAC) may be configured to receive high-pass modulation data for two-point modulation and to receive output from the loop filter for phase locking.

An integrated circuit for two point modulation using a digital phase locked loop is also disclosed. The integrated circuit includes a sampling clock input that is switchable between a plurality of frequencies. The integrated circuit also includes a sigma-delta modulator in a feedback path that receives low-pass modulation data. The integrated circuit also includes a voltage-mode digital-to-analog converter (VDAC) that receives high-pass modulation data. The integrated circuit also includes an analog voltage controlled oscillator coupled to the feedback path and the output of the VDAC. The integrated circuit also includes a phase-to-digital converter (PDC) coupled to the feedback path, a reference frequency and a loop filter.

A two point modulation digital phase locked loop circuit is also disclosed. The circuit includes means for receiving a sampling clock that is switchable between a plurality of frequencies. The circuit also includes means for modulating coupled to a feedback path that receives low-pass modulation data. The circuit also includes means for converting a digital signal to an analog signal that receives high-pass modulation data. The circuit also includes means for producing an oscillation frequency based on a received analog input signal coupled to the feedback path and the output of the means for converting. The circuit also includes means for determining a phase difference between feedback path signal and a reference frequency coupled to a loop filter.

A method for two point modulation is also disclosed. A sampling clock input is received. Low-pass modulation data is provided to a sigma-delta modulator. An analog voltage controlled oscillator (VCO) output is pre-scaled based on an output of the sigma-delta modulator. A phase difference is determined between the sampling clock input and the pre-scaled VCO output. High-pass modulation data is summed with the phase difference, after filtering, to produce a digital VCO control word. The digital VCO control word is converted to an analog control word. The analog control word is provided to the analog VCO.

A computer-program product for two point modulation using a digital phase locked loop is also disclosed. The computer-program product includes a computer-readable medium having instructions thereon. The instructions include code for causing a wireless device to receive a sampling clock input. The instructions also include code for causing a wireless device to provide low-pass modulation data to a sigma-delta modulator. The instructions also include code for causing a wireless device to pre-scale an analog voltage controlled oscillator (VCO) output based on an output of the sigma-delta modulator. The instructions also include code for causing a wireless device to determine a phase difference between the sampling clock input and the pre-scaled VCO output. The instructions also include code for causing a wireless device to sum high-pass modulation data with the phase difference, after filtering, to produce a digital VCO control word. The instructions also include code for causing a wireless device to convert the digital VCO control word to an analog control word. The instructions also include code for causing a wireless device to provide the analog control word to the analog VCO.

DETAILED DESCRIPTION

Figure 1:
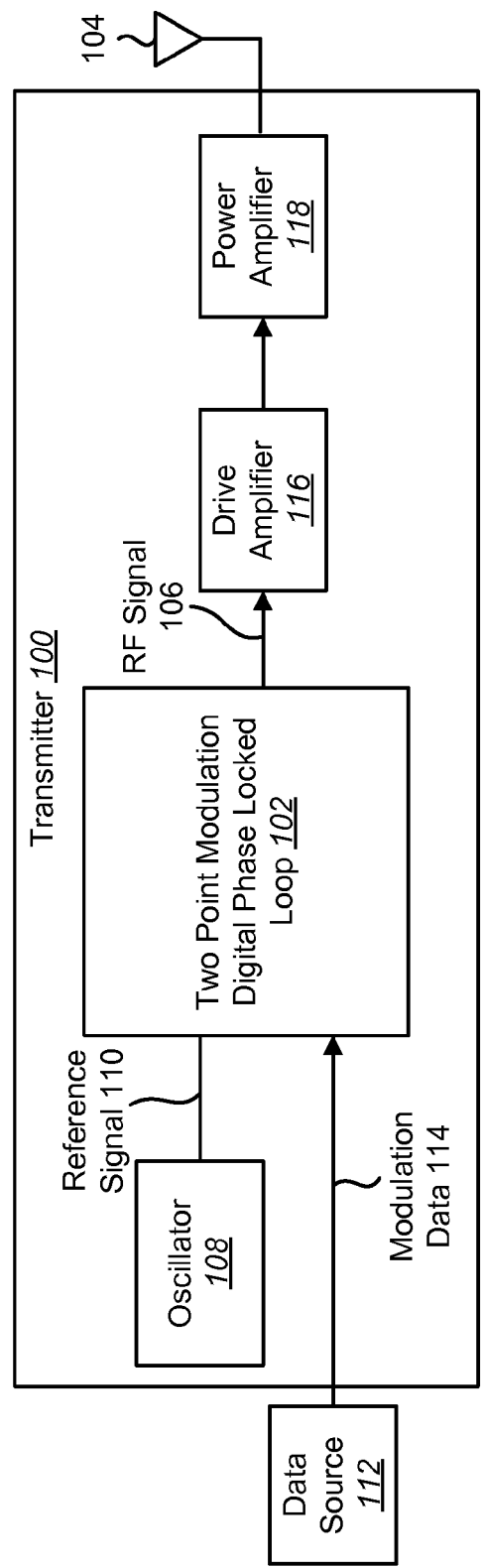
FIG. 1 is a block diagram illustrating a transmitter that uses a two point modulation digital phase locked loop (PLL)

Phase locked loops (PLLs) may be used in circuitry for a variety of reasons, e.g., to generate stable signals at different frequencies. Recently, digital phase locked loops (DPLLs) have become particularly useful in wireless communication devices. For example, a DPLL may be driven by Gaussian minimum shift keying (GMSK) or 8-phase shift keying (8PSK) modulation of data in a Global System for Mobile Communications (GSM) or Enhanced Data rates for GSM Evolution (EDGE) system. Furthermore, implementing digital two point modulation (TPM) in a digital phase-locked loop (DPLL) with a phase-to-digital converter (PDC) is a more power-efficient approach since the radio frequency (RF) accumulator running at the voltage controlled oscillator (VCO) frequency can be removed. However, one of the issues is the selection of an appropriate injection point for the low-pass data. One potential point of injection is the phase-to-digital converter (PDC) output after an accumulator. However, in such architecture, the high-pass gain in a two point modulation (TPM) system is turned into a function of the voltage controlled oscillator (VCO) gain, phase-to-digital converter (PDC) gain and the division ratio, N. Since phase-to-digital converter (PDC) gain is process, voltage and temperature (PVT) dependent, good gain calibration is necessary to minimize the variations of the phase-to-digital converter (PDC) gain. In addition to this, N is channel dependent, which implies that the high-pass gain ($k_u$) cannot be a constant and needs to be changed when different channel is selected. As a result, circuit complexity and power consumption is high. A more robust approach is needed.

Another issue in a digital two point modulation (TPM) is related to its sampling clock. There is tradeoff among spur coupling, power consumption and modulation performance when different sampling clocks are used. Not only the dynamic power consumption, but also the spur coupling through the substrate, increases with the sampling frequency. Yet, when the frequency of the sampling clock is reduced, the modulation performance may be compromised due to higher quantization noise with lower clock rate. Chip area is another tradeoff in a digital TPM system. The input modulation data is split into the high-pass and low-pass paths and applied into two different points. The bit-widths of the input modulation data is doubled when the data is split into two. The number of flip-flops and routing connections involved increase the total chip area. In summary, a new solution for the digital two point modulation (TPM) in a digital phase locked loop (DPLL) is required for less circuit complexity, less power consumption, less spur coupling and small chip area.

Therefore, the present systems and methods may use the following five techniques. First, low-pass data may be applied at the input of a sigma-delta modulator in the feedback path instead of the phase-to-digital converter (PDC) input in the reference path. By applying the data in the feedback path, there is no need to include the phase-to-digital converter (PDC) gain in the digital two point modulation (TPM) system and the complicated phase-to-digital converter (PDC) gain normalization can be removed. Moreover, the high-pass gain may be channel-independent and may not need to be changed according to the channel.

Second, multiple sampling clocks may be used for the digital two point modulation (TPM). Low sampling frequency may be used for less dynamic power consumption and spur coupling. The digital phase-locked loop (DPLL) may be switched to other sampling clocks to reduce the fractional spurs when a near-integer channel is selected.

Third, resolution of the high-pass gain may be programmed when reference clocks are switched. Since the quantization noise is reduced by using higher resolution for lower reference clocks, gain matching of the low-pass and high-pass paths is improved. When a high-pass path and a low-pass path are implemented digitally, the gain and delay matching between the two paths may be more accurate and more adaptable across different process, voltage and temperature (PVT).

Fourth, in order to reduce the quantization noise in the $k_v$ adaptation, a filtered signal after the poles in the loop filter, instead of the loop filter input, may be used as the main input to the $k_v$ adaptation. Multiplication of the bandwidth coefficient to the accumulator output of the $k_v$ adaptation may also be adjusted to preserve the precision of the internal variables.

Fifth, gain scaling in the common path may be removed. Instead, variable gain may be set in the low-pass path for different sampling clocks. The gain in the high-pass path may be handled by $k_v$ adaptation. The bit-widths of the input modulation data may no longer be doubled when the data is split into two. This may reduce the number of flip-flops, routing connections and the overall chip area.

FIG. 1 is a block diagram illustrating a transmitter 100 that uses a two point modulation digital phase locked loop (DPLL) 102. For example, the transmitter 100 may be in a wireless communication device or a base station. While a transmitter 100 is illustrated, the two point modulation digital phase locked loop 102 may be used in other applications, e.g., a receiver. In addition to the two point modulation digital phase locked loop 102, the transmitter 100 may include an oscillator 108, a drive amplifier 116 and a power amplifier 118. The two point modulation digital phase locked loop 102 may receive a reference signal 110 from the oscillator 108 and modulation data 114 from a data source 112. For example, the modulation data 114 may be Gaussian minimum shift keying (GMSK) or 8-phase shift keying (8PSK) data. The reference signal 110 may be a periodic signal at a particular frequency (i.e., the reference frequency) that is used by digital components in the transmitter 100 as a clock signal. The modulation data 114 may be the useful digital data that is to be wirelessly transmitted to another device. The transmitter 100 may process the modulation data 114 in a way to prepare it for transmission, i.e., produce a radio frequency (RF) signal 106 that includes the modulation data 114. For example, if the modulation data 114 has a bandwidth of 100 kHz, the RF signal 106 may be the modulation data 114 with a bandwidth of 100 kHz and a center frequency of 1 GHz or 1.8 GHz. Before the RF signal 106 is transmitted via an antenna 104, it may be amplified by a drive amplifier 116, a power amplifier 118 or both. Thus, the transmitter 100 may use the two point modulation digital phase locked loop 102 to upconvert data into the radio frequency range for transmission. In one configuration, the two point modulation digital phase locked loop 102 may be used for local oscillator 108 generation and modulating phase data instead of an analog phase locked loop in combination with a mixer (not shown).

Figure 2:
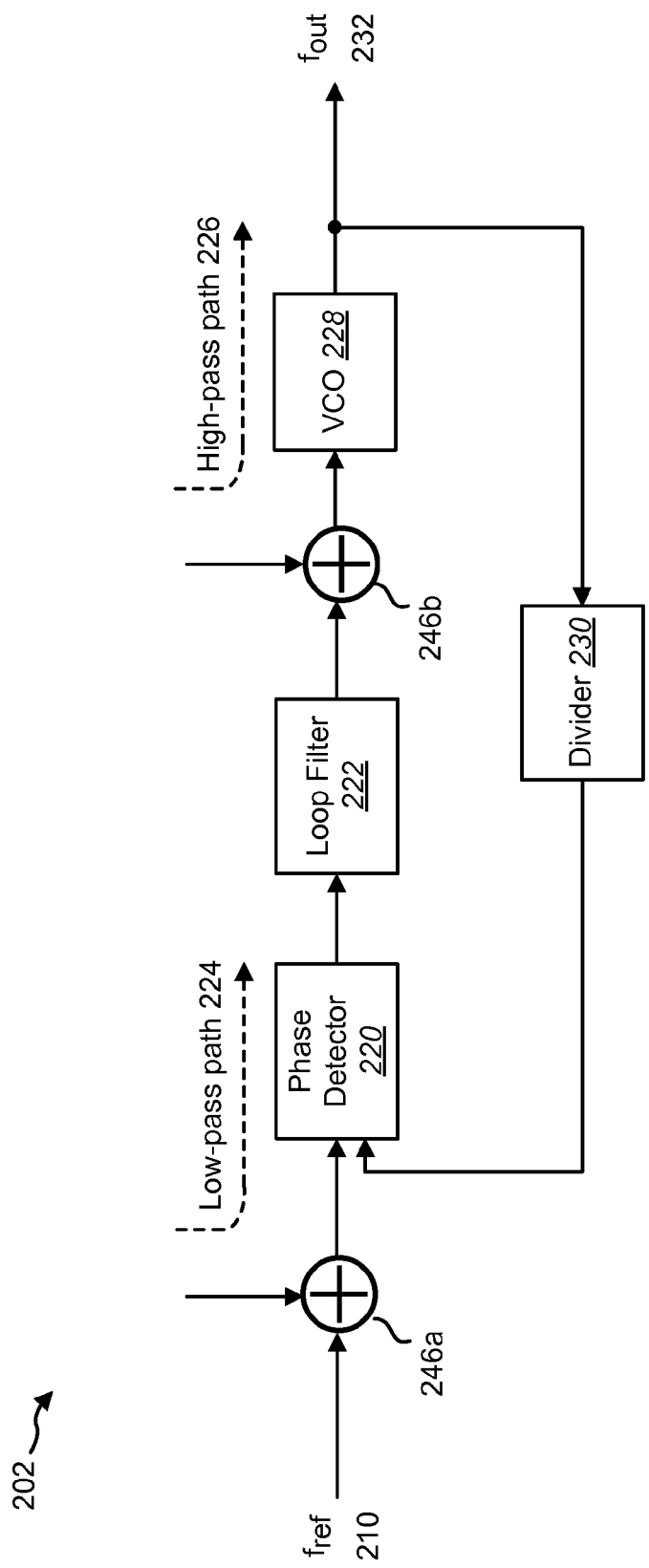
FIG. 2 is a block diagram illustrating two point modulation phase locked loop (PLL)

FIG. 2 is a block diagram illustrating two point modulation phase locked loop (PLL) 202. The phase locked loop 202 may include one or more summers 246a-b, a phase detector 220, a loop filter 222, a voltage controlled oscillator (VCO) 228 and a divider 230. A reference frequency ($f_{ref}$) 210 may be received as input to the phase locked loop 202 and an output frequency may be the output of the phase locked loop 202.

During normal operation, the divider 230 may receive the output ($f_{out}$) 232 of the voltage controlled oscillator (VCO) 228 and divide the frequency by a specified value. The phase detector 220 may compare the phase of the output of the divider 230 with the reference frequency 210 and produce a phase difference. After filtering, the loop filter 222 may output a signal that controls the voltage controlled oscillator (VCO) 228.

In two point modulation, modulation data may be summed with the reference frequency 210 and the output of the loop filter 222. These paths may be referred to as a low-pass path 224 and a high-pass path 226. The low-pass path 224 has low-pass characteristics and the high-pass path 226 has high-pass characteristics. When modulation data is injected into the two paths together and well-compensated (with different gains applied to each path), the modulation bandwidth may not be limited by the bandwidth of the phase locked loop 202. A high-pass path gain may be determined by the strictly-positive real algorithm shown in Equation (1), implemented in discrete time-domain:

$$k_u[n]=k_u[n-1]+\gamma \cdot u[n-1] \cdot \epsilon[n-1] \quad (1)$$

where n is an index, $k_u$ is the adaptation gain for the high-pass path 226, $\gamma$ is the bandwidth coefficient for the loop 202, u is the input modulation data and $\epsilon$ is the phase difference from the phase detector 220.

In addition to advantages, however, two point modulation may have several problems. High-pass gain in a two point modulation system may be a function of voltage controlled oscillator (VCO) 228 gain, phase-to-digital converter (PDC) gain (in digital phase locked loops), and the division ratio (N) of the divider 230. The phase-to-digital converter (PDC) gain is process, voltage and temperature (PVT) dependent. Thus, good phase-to-digital converter (PDC) calibration may be used. N may be channel dependent. Furthermore, dynamic power consumption and spur coupling through the substrate increases with the sampling frequency. Modulation performance may be compromised with low sampling frequency due to the higher quantization noise with a lower clock rate.

Figure 3:
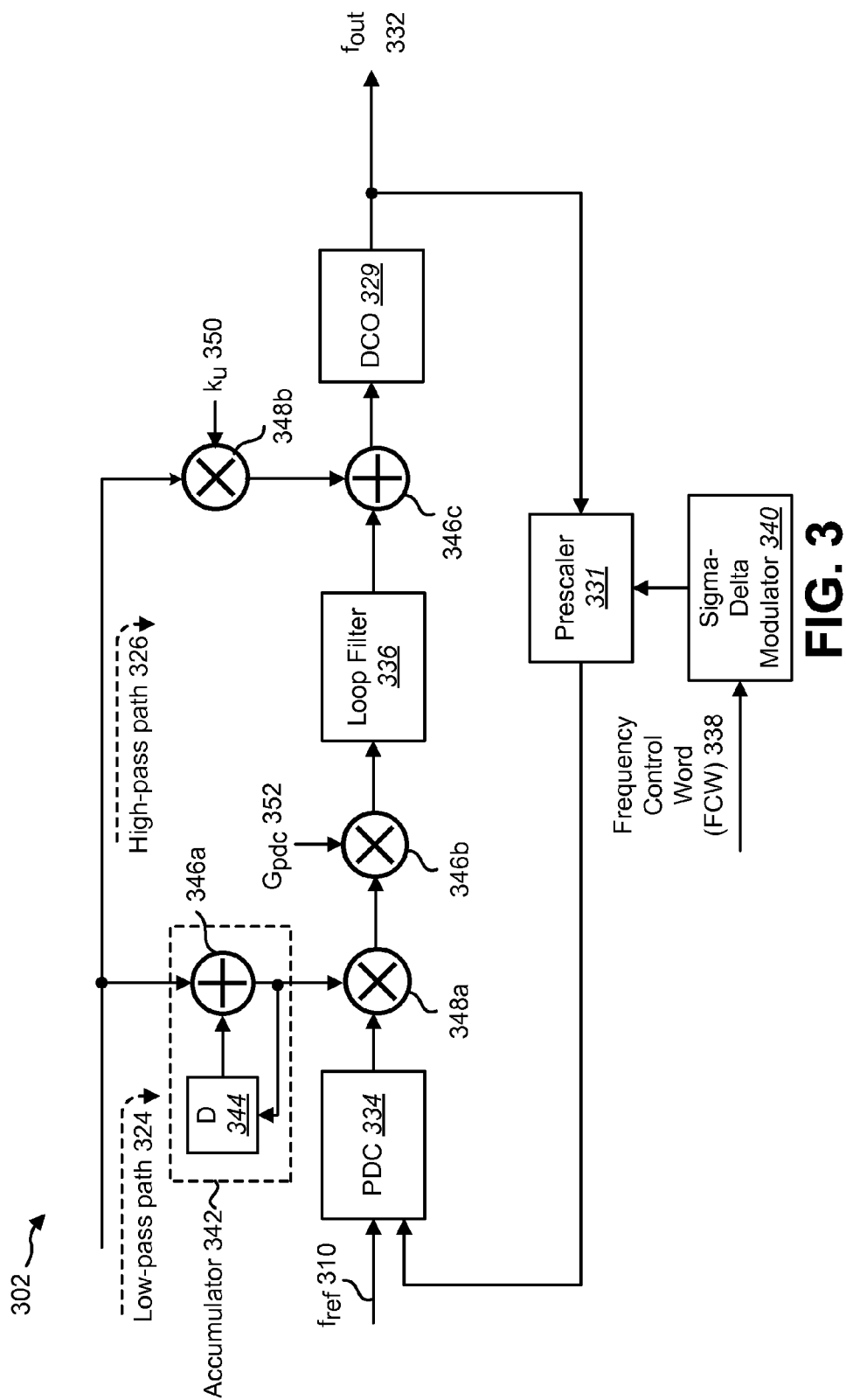
FIG. 3 is a block diagram illustrating one possible configuration of two point modulation in a phase locked loop (PLL)

FIG. 3 is a block diagram illustrating one possible configuration of two point modulation in a phase locked loop (PLL) 302. In contrast to the phase locked loop 202 illustrated in FIG. 2, the phase locked loop 302 illustrated in FIG. 3 is a digital phase locked loop 302, i.e., at least the phase-to-digital converter (PDC) 334 and the loop filter 336 may be implemented digitally using the reference frequency 310. The phase-to-digital converter (PDC) 334 may determine a phase difference between the reference frequency 310 and the output of a prescaler 331 that is controlled by a sigma delta modulator 340 based on a frequency control word (FCW) 338. The loop filter 336 may then control a digitally controlled oscillator (DCO) 329.

In this configuration, modulation data may be injected into the phase locked loop 302 in a low-pass path 324 after the phase-to-digital converter 334 and in a high-pass path 326 after the loop filter 336. Specifically, an accumulator 342 that includes a delay element 344 and a summer 346a may be used to combine current modulation data with previous modulation data. This combined modulation data may be multiplied with the output of the phase-to-digital converter (PDC) 334 using a multiplier 348a. The modulation data in the high-pass path 326 may be multiplied (using another digital multiplier 348b) by a high-pass gain ($k_u$) 350 before being added (using another adder 346c) to the loop filter output 336 and used to control the digitally controlled oscillator (DCO) 329 and produce $f_{out}$ 332.

However, this configuration may be complex to implement. For example, the low-pass gain may need to be scaled (using $G_{PDC}$ 352 and a multiplier 346b) to match the phase scale. This implies that phase-to-digital converter (PDC) 334 gain calibration may be necessary, which may increase the design complexity. In other words, the high pass gain ($k_u$) 350 in the phase locked loop 302 may be a function of digitally controlled oscillator (DCO) 329 gain, phase-to-digital converter (PDC) 334 gain and a division ratio (N) of the prescaler. Since phase-to-digital converter (PDC) 334 gain is dependent on process, voltage and temperature (PVT) and N is channel-dependent, the calibration using $G_{PDC}$ 352 may be complex. Furthermore, non-linearity in the tuning capacitors of the DCO 329 may cause significant output radio frequency spectrum variations.

Figure 4:
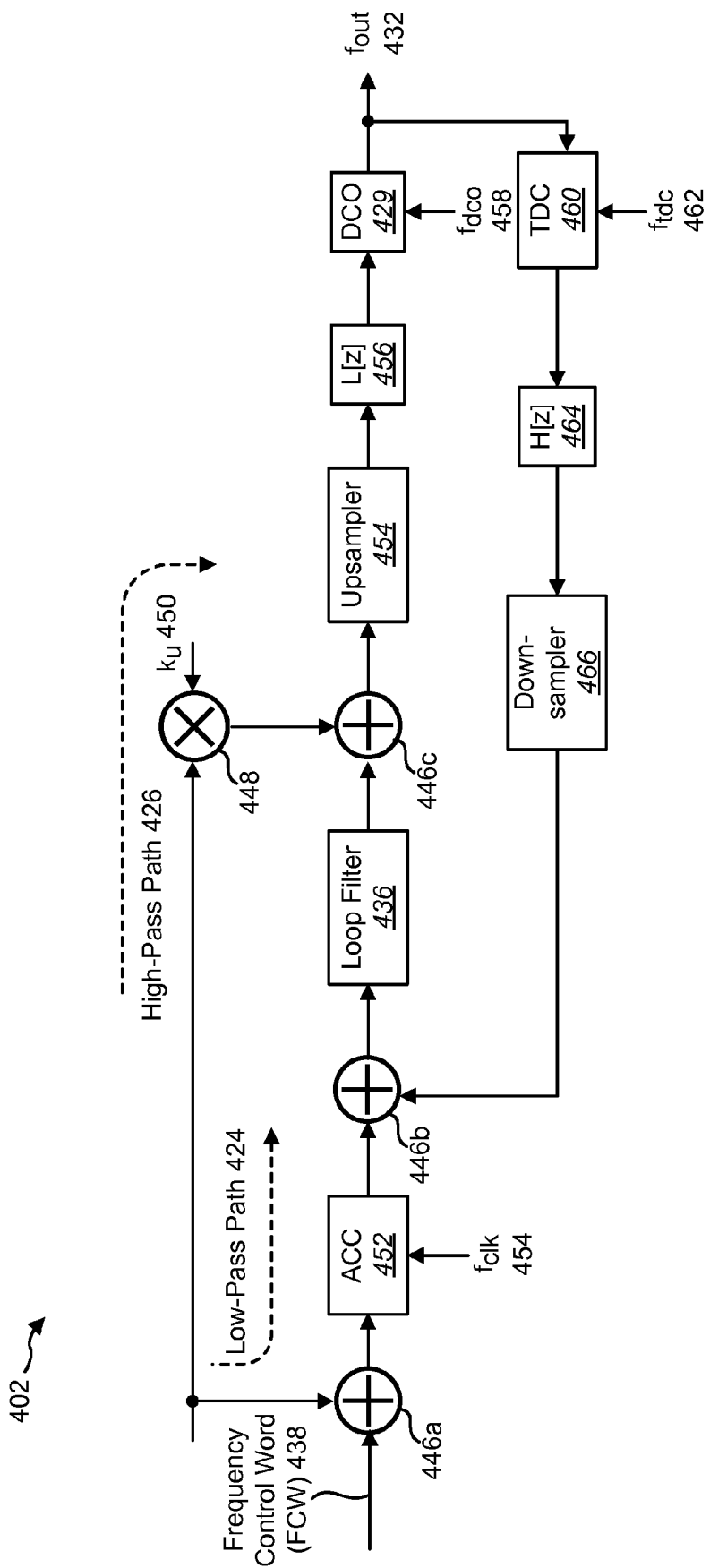
FIG. 4 is a block diagram illustrating one possible configuration of a multi-rate phase locked loop (PLL)

FIG. 4 is a block diagram illustrating one possible configuration of a multi-rate phase locked loop (PLL) 402. The modules in a multi-rate PLL 402 may use different sampling clock speeds. A fast clock may be used only for those modules that benefit from better quantization noise (e.g., a digitally controlled oscillator (DCO) 429 and a time-to-digital converter (TDC) 460). The remaining modules may use a slower clock to reduce current consumption. In this configuration, the modulation data in the low-pass path 424 may be summed with a frequency control word (FCW) 438 at an adder 446a and fed to an accumulator (ACC) module 452. The ACC module 452 may be controlled by a clock signal ($f_{clk}$) 454. The output of the ACC module 452 may be summed (by another adder 446b) and fed into a loop filter 436. The output of the loop filter 436 may be summed (by another adder 446c) with the gain-adjusted modulation data from the high-pass path 426. As before, the high-pass gain ($k_u$) 450 may be derived (e.g., according to Equation (1)) and may be applied by a digital multiplier 448. After injection of the high-pass modulation data, an upsampler 454 may upsample the signal by adding the appropriate number of zeros onto the data to match its low-speed sampling clock to the fast clock. A first transfer function (L[z]) 456 may be applied to interpolate the values at the zeros added by the upsampler 454, i.e., L[z] 456 may be the filter for the upsampler 454. The output of the first transfer function (L[z]) 456 may control a digitally controlled oscillator (DCO) 429 that produces the output frequency ($f_{out}$) 432 of the multi-rate PLL 402. The digitally controlled oscillator (DCO) 429 may operate based on a digitally controlled oscillator (DCO) clock frequency ($f_{DCO}$) 458.

A time-to-digital converter (TDC) 460 may be placed in the feedback loop of the multi-rate PLL 402. The time-to-digital converter (TDC) 460 may operate using a time-to-digital converter (TDC) clock frequency ($f_{TDC}$) 462. A second transfer function (H[z]) 464 may be applied to the output of the time-to-digital converter (TDC) 460. The output of the second transfer function (H[z]) 464 may be fed to a downsampler 466 to match the rate of the high-speed sampling clock to the slow clock of the following modules, i.e., H[z] 464 may be the filter for the downsampler 466. The downsampler 466 output may then be summed with the output of the advanced clock control (ACC) module 452.

This configuration may have several limitations. First, the different clock frequencies (i.e., $f_{clk}$ 454, $f_{DCO}$ 458 and $f_{TDC}$ 462) may mix together through non-linear distortion and generate more low-frequency spurs. Second, interpolation and decimation from the upsampler 454 and downsampler 466 may introduce delay and degrade the phase margin. Third, the time-to-digital converter (TDC) 460 may consume high power and introduce complexity because it runs at a relatively high frequency. Fourth, the high-pass gain ($k_u$) 450 may be a function of the time-to-digital converter (TDC) 460, which may require time-to-digital converter (TDC) 460 normalization. Also, as before, non-linearity in the tuning capacitors of the digitally controlled oscillator (DCO) 429 may cause significant output radio frequency spectrum variations (ORFS).

Figure 5:
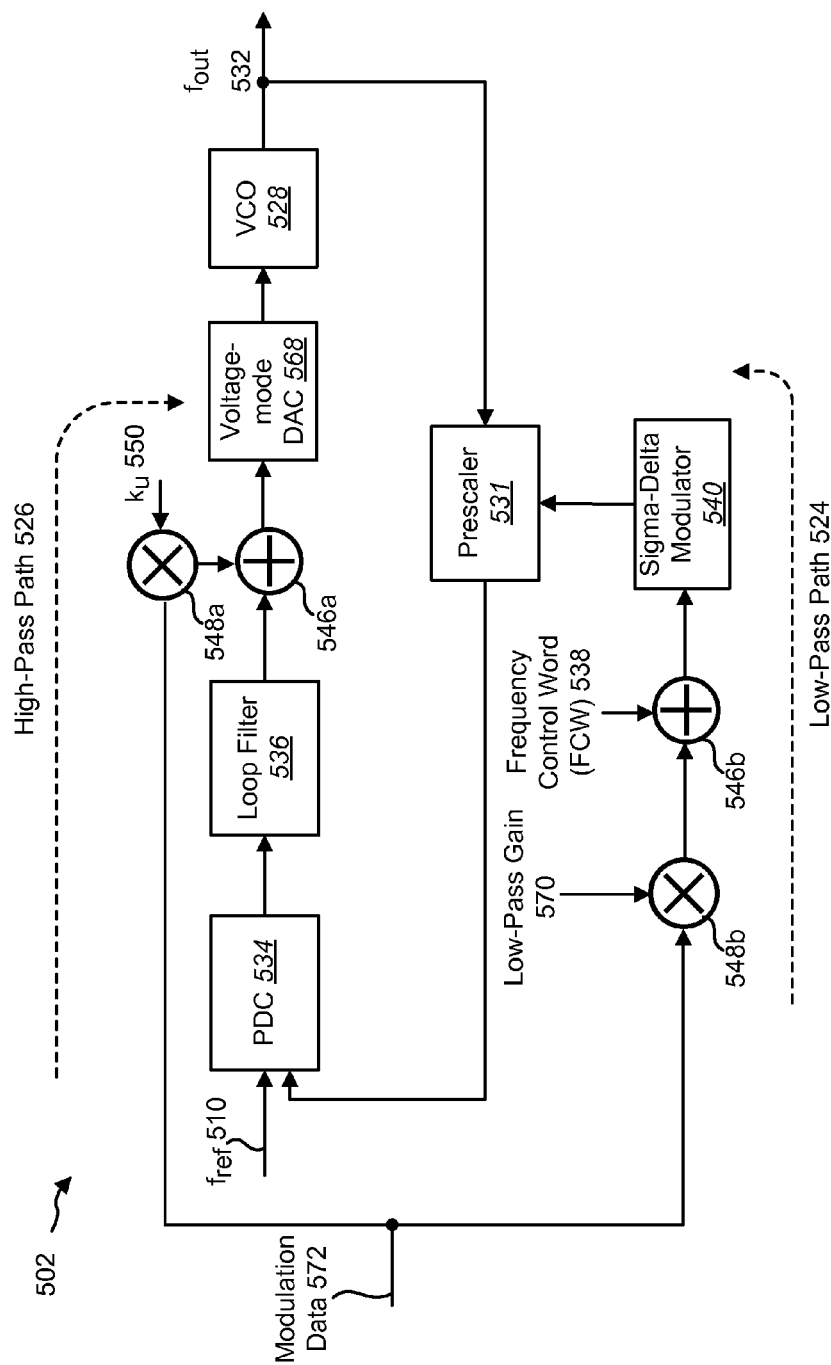
FIG. 5 is a block diagram illustrating one configuration of a two point modulation digital phase locked loop (DPLL)

FIG. 5 is a block diagram illustrating one configuration of a two point modulation digital phase locked loop (DPLL) 502. The configuration illustrated in FIG. 5 may address many of the problems discussed previously. Specifically, the configuration may utilize switchable sampling clocks in a digital phase locked loop (DPLL) 502 for less noise, less circuit complexity, less power consumption and less reference spur coupling.

Another advantage of the DPLL 502 may be the use of a phase-to-digital converter (PDC) 534 and a sigma-delta modulator 540 instead of a time-to-digital converter (TDC) with an accumulator. A time-to-digital converter (TDC) and accumulator may have high power consumption since they operate at a high frequency, e.g., $f_{out}/2$. In contrast, the phase-to-digital converter (PDC) 534 and a sigma-delta modulator 540 may operate at a lower frequency (e.g., $f_{ref}$ 510), resulting in lower current consumption. Furthermore, the time-to-digital converter (TDC) gain may need to be normalized in two point modulation, while the phase-to-digital converter (PDC) 534 gain does not need normalization if the data is applied at the sigma-delta modulator 540.

During operation, the phase-to-digital converter (PDC) 534 may determine a phase error, or phase difference, between a reference frequency ($f_{ref}$) 510 and the output of a prescaler 531. In one configuration, the phase-to-digital converter (PDC) 534 may be a digital module, using the reference frequency ($f_{ref}$) 510 as a clock, which determines the phase error and a control word based on the phase error. In other words, the phase-to-digital converter (PDC) 534 may be used in place of a phase detector and a charge pump in an analog phase locked loop. After filtering, a digital loop filter 536 may sum the phase-to-digital converter (PDC) 534 output with high-pass, gain-scaled modulation data, i.e., the modulation data 572 may have a high-pass gain ($k_u$) 550 applied at a digital multiplier 548a before the adder 546a. The summed, filtered, phase-to-digital converter (PDC) 534 output and high-pass modulation data may be input to a single voltage-mode digital-to-analog converter (VDAC) 568. In this configuration, only a single voltage-mode digital-to-analog converter (VDAC) 568 may be used in the PLL 502. It serves two functions. The first function is the digital-to-analog conversion before the analog VCO 528 during phase and frequency locking. The other function is to allow the digital high-pass modulation data to be injected into the PLL 502. As discussed below, a voltage-mode digital-to-analog converter (VDAC) 568, instead of a current-mode digital-to-analog converter (not shown), may introduce less noise to the digital phase locked loop (DPLL) 502. The voltage-mode digital-to-analog converter (VDAC) 568 may output an analog control signal for an analog voltage controlled oscillator (VCO) 528. The analog voltage controlled oscillator (VCO) 528, instead of a digitally controlled oscillator (DCO) 329, 429, may not introduce differential non-linearity that causes output radio frequency spectrum (ORFS) variations.

The prescaler 531 in the feedback loop may scale the output frequency ($f_{out}$) 532 of the voltage controlled oscillator (VCO) 528 based on a sigma-delta modulator (SDM) 540. The sigma-delta modulator (SDM) 540 may be controlled by digital modulation data 572 that has been multiplied by a low pass gain 570 (using another digital multiplier 548b) and summed with a frequency control word (FCW) 538 (using another adder 546b), i.e., the sigma-delta modulator 540 may receive low-pass modulation data. The sigma-delta modulator 540 may be similar to those used in a fractional-n frequency synthesizer. The modulation data together with the frequency control word (FCW) 538 in the format of digital words may be converted to multi-level outputs by the sigma-delta modulator 540 to dither the division ratio of the prescaler 531. The noise shaping property of the sigma delta modulator 540 may shift the quantization noise to relatively higher frequency, which may then be attenuated by the low pass characteristic of the PLL 502.

Therefore, in the two point modulation digital phase locked loop 502 illustrated in FIG. 5, the modulation data 572 is applied at a high-pass point, i.e., the voltage controlled oscillator (VCO) 528 control voltage with the help of the voltage-mode digital-to-analog converter (VDAC) 568 after travelling along the high-pass path 526. The modulation data 572 is also applied at a low-pass point in the feedback path which is the input of sigma-delta modulator 540, i.e., after travelling along the low-pass path 524. By applying the low-pass data in the feedback path, instead of injecting the data at the phase-to-digital converter (PDC) 534 output, it is unnecessary to compensate for the phase-to-digital converter (PDC) 534 gain and the complex phase-to-digital converter (PDC) 534 gain normalization may be removed. The high-pass gain may be channel-independent and may not need to be changed according to the channel. The introduction of the modulation data 572 in the feedback path also introduces small phase variations at the phase-to-digital converter (PDC) 534 input. In contrast, large phase variations may be introduced if injected at a crystal oscillator or the phase-to-digital converter (PDC) 534 output. This may impose a less stringent requirement on the phase-to-digital converter (PDC) 534 dynamic range.

Furthermore, multiple sampling clocks can be used for the two point modulation digital phase locked loop (DPLL) 502. Therefore, noise, spurious performance and power consumption may be optimized by choosing the appropriate clock. In other words, all the digital components in the digital phase locked loop (DPLL) 502 (i.e., the phase-to-digital converter (PDC) 534, the loop filter 536, the digital multipliers 548a-b, the adders 546a-b and the sigma-delta modulator 540) may operate using the same sampling clock, e.g., the reference frequency ($f_{ref}$) 510. This sampling clock may be switchable between several different frequencies. Therefore, by choosing the appropriate sampling clock with preference given to lower speeds, dynamic power consumption may be reduced. A switchable sampling clock may reduce phase error in Global System for Mobile Communications (GSM) and the error vector magnitude (EVM) in Enhanced Data rates for GSM Evolution (EDGE). Additionally, a switchable sampling clock may reduce reference/fractional spur coupling through the substrate that may cause output radio frequency spectrum variations (ORFS).

Figure 6:
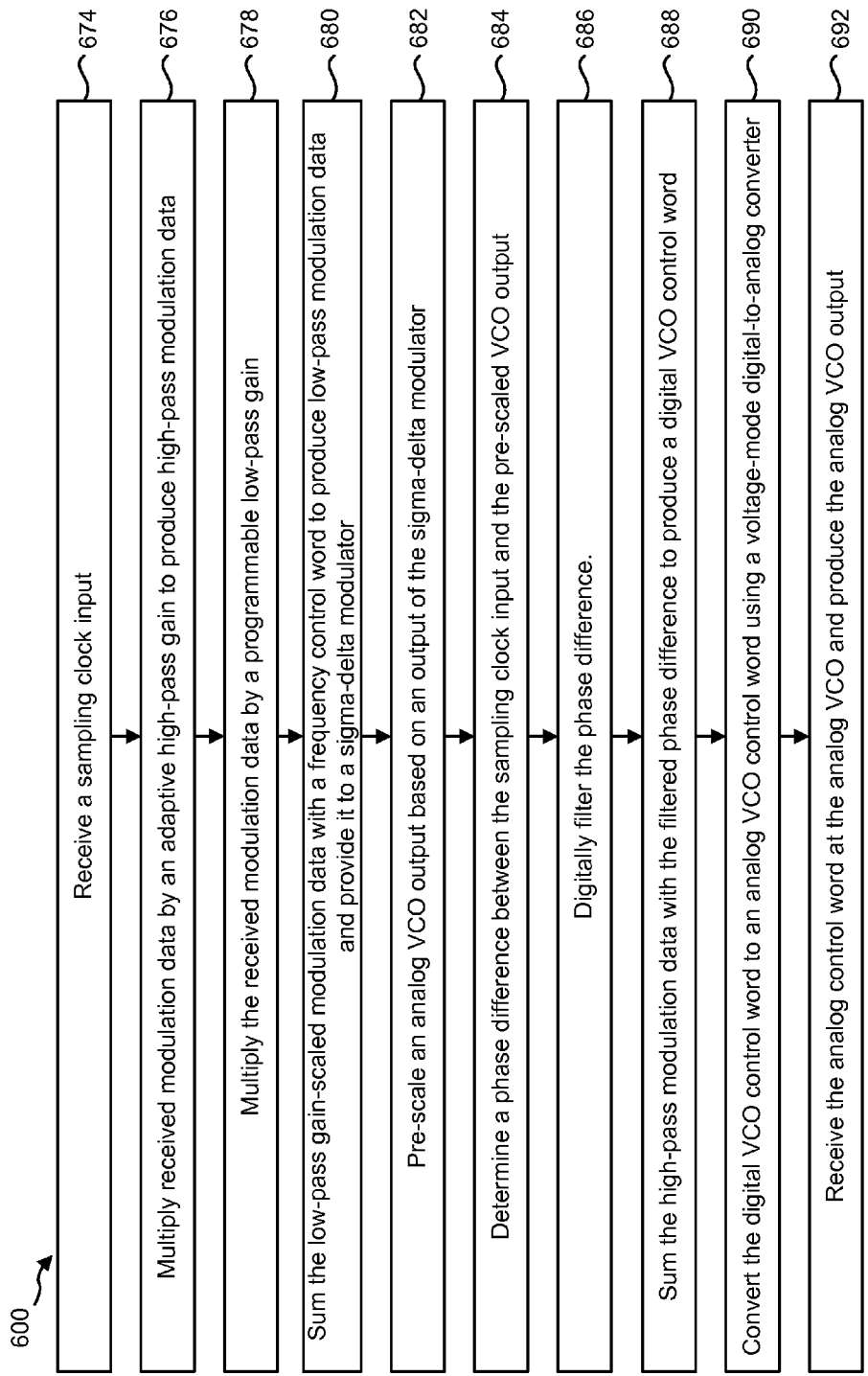
FIG. 6 is a flow diagram illustrating a method for two point modulation.

FIG. 6 is a flow diagram illustrating a method 600 for two point modulation. The method 600 may be performed by a two point modulation digital phase locked loop (DPLL) 502. The digital phase locked loop (DPLL) 502 may receive 674 a sampling clock input. The sampling clock input may be the reference frequency ($f_{ref}$) 510 input to the digital phase locked loop (DPLL) 502 and may be used by all digital modules within the digital phase locked loop (DPLL) 502. Furthermore, the sampling clock may be switchable between multiple frequencies. The digital phase locked loop (DPLL) 502 may also multiply 676 received modulation data 572 by an adaptive high-pass gain ($k_u$) 550 to produce high-pass modulation data. As discussed below, the modulation data 572 may also be multiplied by a high-pass gain resolution adjustment to produce the high-pass modulation data. The digital phase locked loop (DPLL) 502 may also multiply 678 the received modulation data 572 by a programmable low-pass gain 570. The digital phase locked loop (DPLL) 502 may also sum 680 the low-pass gain-scaled modulation data with a frequency control word 538 to produce low-pass modulation data and provide it to a sigma-delta modulator 540. The digital phase locked loop (DPLL) 502 may also pre-scale 682 an analog voltage controlled oscillator (VCO) 528 output (i.e., the output frequency 532) using a prescaler 531. The digital phase locked loop (DPLL) 502 may also determine 684 a phase difference between the sampling clock input 510 and the pre-scaled voltage controlled oscillator (VCO) 528 output, i.e., in the phase-to-digital converter (PDC) 534. The digital phase locked loop (DPLL) 502 may also digitally filter 686 the phase difference. The digital phase locked loop (DPLL) 502 may also sum 688 the high-pass modulation data with the filtered phase difference to produce a digital voltage controlled oscillator (VCO) 528 control word. The digital phase locked loop (DPLL) 502 may also convert 690 the digital voltage controlled oscillator (VCO) 528 control word to an analog voltage controlled oscillator (VCO) 528 control word using a voltage-mode digital-to-analog converter (VDAC) 568. The digital phase locked loop (DPLL) 502 may also receive 692 the analog control word at the analog voltage controlled oscillator (VCO) 528 and produce the analog voltage controlled oscillator (VCO) output 532.

Figure 7:
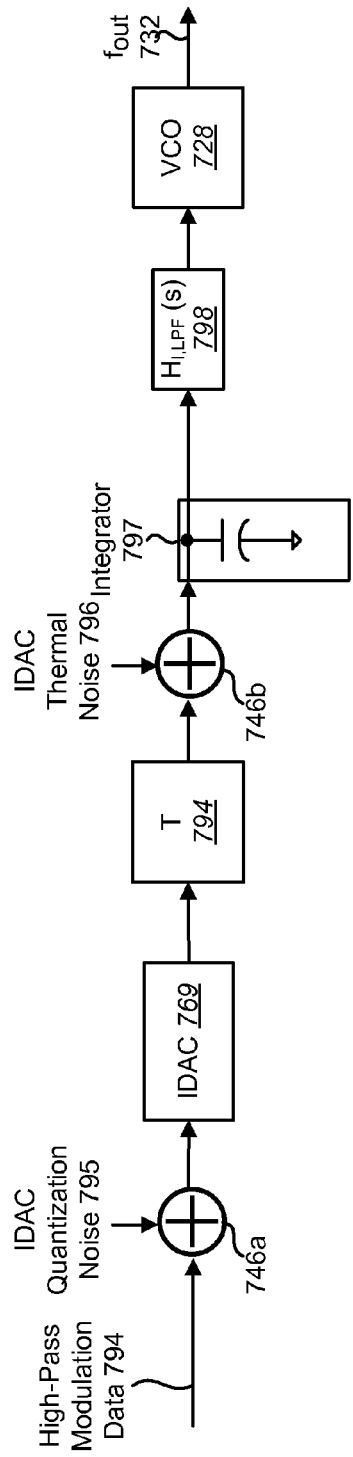
FIG. 7 is a block diagram illustrating part of a feed-forward path of a phase-locked loop (PLL) using a current-mode digital-to-analog converter (IDAC)

FIG. 7 is a block diagram illustrating part of a feed-forward path of a phase-locked loop (PLL) using a current-mode digital-to-analog converter (IDAC). High-pass modulation data 794 (i.e., modulation data 572 that has been scaled by a high pass gain 550 and combined with a phase-to-digital converter (PDC) 534 output) may have current-mode digital-to-analog converter (IDAC) quantization noise 795 introduced. While modeled with adders 746a-b, the addition of unwanted noise 795, 796 may occur without explicit circuitry. The noisy high-pass modulation data 794 may then be input into the current-mode digital-to-analog converter (IDAC) 769. For the purpose of analysis, the current-mode digital-to-analog converter (IDAC) 769 may be modeled as a zero order hold filter (ZOH) as a function of time s, i.e., ZOH(s). After the digital-time to continuous time interface (T) 794, the current-mode digital-to-analog converter (IDAC) 769 output may have current-mode digital-to-analog converter (IDAC) thermal noise 796 introduced before integration by an integrator 797. A transfer function 798 ($H_{I,LPF}(s)$) is used to model the transfer function of the loop filter in the PLL. A voltage controlled oscillator (VCO) 728 may then produce $f_{out}$ 732. The transfer function of the IDAC may be given according to Equation (2):

$$H_{IDAC}(s) = \frac{ZOH_I(s) \cdot \frac{1}{sK_{int}} H_{I,LPF}(s) \cdot \frac{K_{vco}}{s}}{1 + H_{I,OL}(s)} \quad (2)$$

where s is an index in time, $ZOH_I(s)$ is the zero order hold filter of the current-mode digital-to-analog converter (IDAC) 769, $K_{int}$ is the gain of the integrating capacitor 797, $K_{vco}$ is the tuning sensitivity of the voltage controlled oscillator (VCO) 728, $H_{I,LPF}(s)$ is the transfer function of the loop filter and $H_{I,OL}(s)$ is the open-loop transfer function of the digital phase locked loop (DPLL). Therefore, the transfer function, $H_{IDAC}(s)$ may be low-pass, which allows low-frequency noise to be passed to the output of the digital phase locked loop (DPLL) 502, resulting in a relatively high integrated power noise (IPN).

Figure 8:
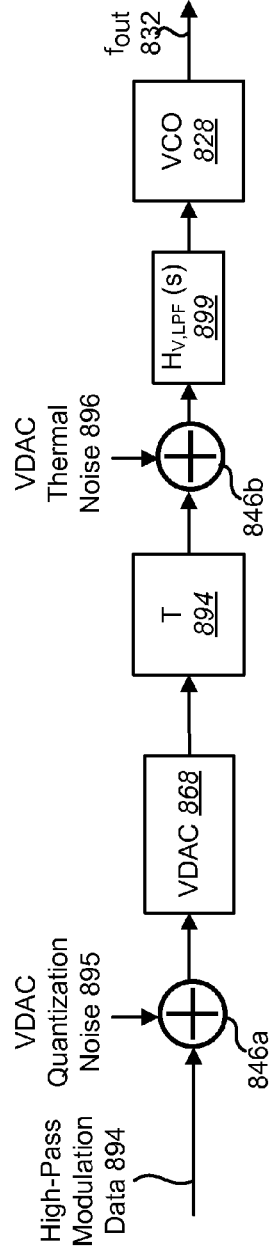
FIG. 8 is a block diagram illustrating part of the feed-forward path of a phase locked loop (PLL) using a voltage-mode digital-to-analog converter (VDAC)

FIG. 8 is a block diagram illustrating part of the feed-forward path of a phase locked loop (PLL) using a voltage-mode digital-to-analog converter (VDAC) 868. High-pass modulation data 894 (i.e., modulation data 572 that has been scaled by a high pass gain 550 and combined with a control word) may have VDAC quantization noise 895 introduced. While modeled with adders 846a-b, the addition of unwanted noise 895, 896 may occur without explicit circuitry. The noisy high-pass modulation data 894 may then be input into the voltage-mode digital-to-analog converter (VDAC) 868. For the purpose of analysis, the voltage-mode digital-to-analog converter (VDAC) 868 may be modeled as a zero order hold (ZOH) filter as a function of time s, i.e., ZOH(s). After the digital-time to continuous-time interface (T) 894, the voltage-mode digital-to-analog converter (VDAC) 868 output may have voltage-mode digital-to-analog converter (VDAC) thermal noise 896 introduced. A transfer function ($H_{v,LPF}(s)$) 899 is used to model the transfer function in the PLL. A voltage controlled oscillator (VCO) 828 may then produce $f_{out}$ 832. The transfer function of the voltage-mode digital-to-analog converter (VDAC) 868 may be given according to Equation (3):

$$H_{VDAC}(s) = \frac{ZOH_V(s) \cdot H_{V,LPF}(s) \cdot \frac{K_{vco}}{s}}{1 + H_{V,OL}(s)} \quad (3)$$

where s is an index in time, $ZOH_V(s)$ is the zero order hold filter of the VDAC 868, $K_{vco}$ is the tuning sensitivity of the voltage controlled oscillator (VCO) 828, $H_{V,LPF}(s)$ 899 is the transfer function of the loop filter and $H_{V,OL}(s)$ is the open-loop transfer function of the digital phase locked loop (DPLL). There is no integrating capacitor in this configuration, thus the $$\frac{1}{sK_{int}}$$

factor is removed from Equation (3).

Therefore, the transfer function, $H_{VDAC}(s)$ may be band-pass, which limits low-frequency noise and high-frequency noise passed to the output of the digital phase locked loop (DPLL) 502, resulting in a better integrated power noise (IPN). In other words, the in-band noise contribution of a voltage-mode digital-to-analog converter (VDAC) 868 to a digital phase locked loop (DPLL) 502 is less than an current-mode digital-to-analog converter (IDAC) 769 because the noise transfer function of the voltage-mode digital-to-analog converter (VDAC) 868 is band-pass instead of low-pass. Since a current-mode digital-to-analog converter (IDAC) 769 may be one of the main noise contributors in a digital phase locked loop (DPLL) 502, using a voltage-mode digital-to-analog converter (VDAC) 868, instead of a current-mode digital-to-analog converter (IDAC) 769 may result in improved performance.

Figure 9:
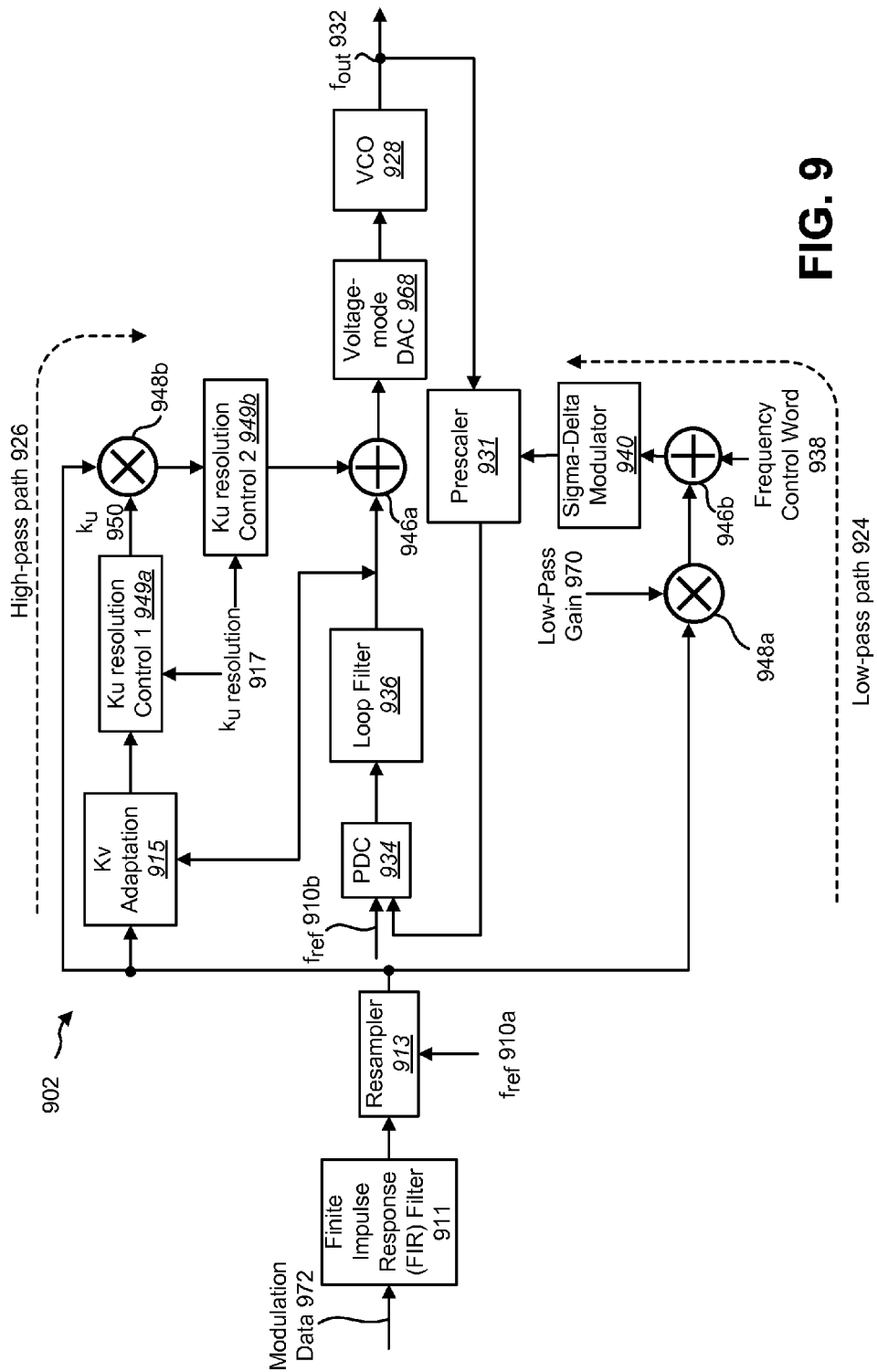
FIG. 9 is a block diagram illustrating another configuration of a two point modulation digital phase locked loop (DPLL)

FIG. 9 is a block diagram illustrating another configuration of a two point modulation digital phase locked loop (DPLL) 902. The two point modulation digital phase locked loop (DPLL) 902 may include a phase-to-digital converter (PDC) 934, a loop filter 936, a voltage-mode digital-to-analog converter (VDAC) 968, an analog voltage controlled oscillator (VCO) 928, a prescaler 931, a sigma-delta modulator 940 and multiple adders 946a-b and digital multipliers 948a-b that include similar functionality as the phase-to-digital converter (PDC) 534, loop filter 536, voltage-mode digital-to-analog converter (VDAC) 568, analog voltage controlled oscillator (VCO) 528, prescaler 531, sigma-delta modulator 540, adders 546a-b and digital multipliers 548a-b in FIG. 5, respectively.

Furthermore, the input modulation data 972 is processed by a finite impulse response (FIR) filter 911 and resampled (by a resampler 913) according to the sampling frequencies $(f_{ref})$ 910a. The processed modulation data 972 may then be applied to both high-pass and low-pass points. The low-pass data may be applied at the sigma-delta modulator 940 (that is controlled by a frequency control word 938) in the feedback path. The high-pass data is applied at the voltage-mode digital-to-analog converter (VDAC) 968 input before the voltage controlled oscillator (VCO) 928. A voltage-mode digital-to-analog converter (VDAC) 968, as opposed to a current-mode digital-to-analog converter (IDAC), may be used for less RX-band noise contribution. The voltage controlled oscillator (VCO) 928 may then produce an output frequency $(f_{out})$ 932 based on the input.

The sampling clock for the two point modulation digital phase locked loop (DPLL) 902 may be the same as the reference frequency $(f_{ref})$ 910b and may be switchable between different frequencies, e.g., $0.5 \times f_{ref}$. Gain matching for different sampling frequencies in the low-pass path 924 and the high-pass path 926 may be done by setting the gain scaling (i.e., the low-pass gain 970) for the low-pass modulation data and enabling $k_v$ adaptation 915 to find the gain $(k_u)$ 950 for the high-pass path 926. All the gain scaling in the finite impulse response filter 911 and the resampler 913 may be removed and put together in the low-pass path 924 to reduce the input bit-width of the high-pass path 926. In other words, there may not be any gain scaling in the common path. Rather, a variable gain (i.e., the low-pass gain 970) may be switched for different sampling clocks and applied the low-pass path 924. The gain $(k_u)$ 950 in the high-pass path 926 may be calculated by the $k_v$ adaptation module 915. This may reduce the bit-width of the high-pass path 926 and the overall chip area.

Moreover, the resolution of the high-pass gain $(k_u)$ 950 (i.e., $k_u$ resolution 917) may be optimized/programmed for different sampling frequencies to achieve the best performance. The $k_u$ resolution 917 may be a programmable variable that controls the number of bits of ku 950 to be sent for its multiplication with the modulation data. More specifically, the first $k_u$ resolution control 949a and second resolution control 949b may be controlled by a $k_u$ resolution adjustment 917. The first $k_u$ resolution control 949a may control the resolution of the product of the high-pass gain $(k_u)$ 950 and the modulation data 972 based on the reference frequency 910a-b. The second $k_u$ resolution control 949a may be used to restore the overall gain. Precision of the product after multiplication may increase when the number of bits of $k_u$ 950 is increased. For example, quantization noise in the two point modulation digital phase locked loop (DPLL) 902 may be reduced by using $k_u$ resolution 917 for lower sampling clocks, i.e., a higher $k_u$ resolution 917 may be used for lower sampling clocks. The $k_u$ resolution 917 may be programmed when different sampling clock is selected. As a result, gain matching of the low-pass path 924 and high-pass path 926 may be improved. The filtered signal from the loop filter 936 may be used as the main input to the $k_v$ adaptation module 915 and gain scaling may be moved to the last stage. This may improve gain matching, particularly at low sampling frequencies, in addition to reducing quantization noise in the $k_v$ adaptation module 915. The first $k_u$ resolution control 949a and second resolution control 949b may be implemented by signed right-shift and left-shift operators.

Figure 10:
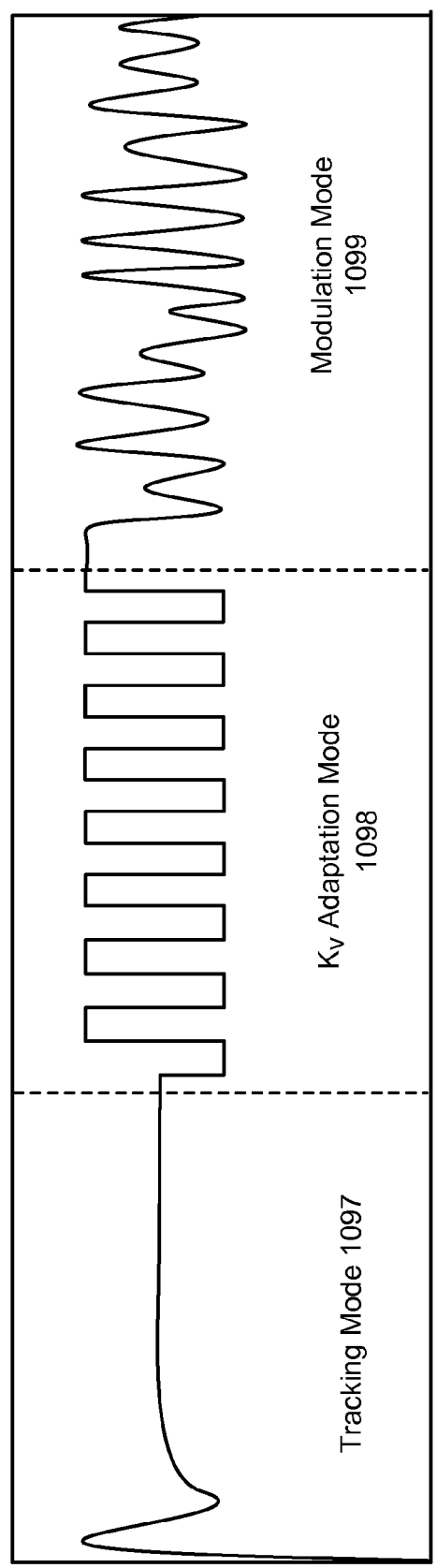
FIG. 10 is a timing illustrating the output of a voltage controlled oscillator (VCO) during $k_v$ adaptation.

FIG. 10 is a timing illustrating the output of a voltage controlled oscillator (VCO) 928 during $k_v$ adaptation. In other words, FIG. 10 illustrates $f_{out}$ 932 before, during and after the digital phase locked loop (DPLL) 902 determines the high-pass gain $(k_u)$ 950. Before modulation starts, the low-pass gain 970 is scaled according to the reference frequencies. Then $k_v$ adaptation training data may be applied to the finite impulse response (FIR) filter 911 during the tracking mode 1097 of the digital phase locked loop (DPLL) 902 to find the correct high-pass gain $(k_u)$ 950. When $k_v$ adaptation 1098 ends, the converged $k_u$ 950 value may be stored and used as the scaling factor for the modulation data in the high-pass path 926, i.e., in modulation mode 1099.

Figure 11:
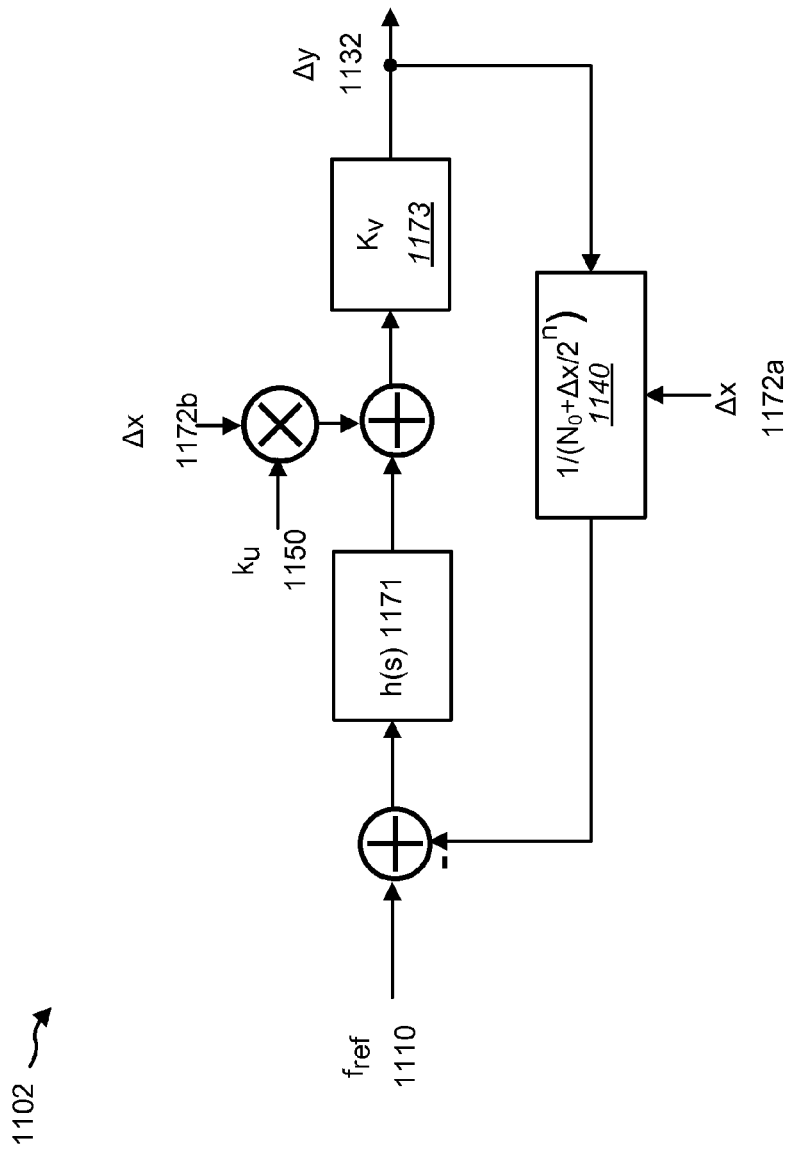
FIG. 11 is a block diagram illustrating a simplified two point modulation digital phase locked loop (DPLL)

FIG. 11 is a block diagram illustrating a simplified two point modulation digital phase locked loop (DPLL) 1102. In other words, FIG. 11 may illustrate a simplified s-domain model of the two point modulation digital phase locked loop 902 illustrated in FIG. 9. The transfer function of the digital phase locked loop (DPLL) 1102 may be given according to Equation (4):

$$\frac{\Delta y}{\Delta x} = \frac{\left[k_u K_v \frac{2^n}{f_{ref}} + \frac{2^n}{2^n N_0 + \Delta x} h(s) K_v\right]}{1 + \frac{2^n}{2^n N_0 + \Delta x} h(s) K_v} \quad (4)$$

where $\Delta y$ 1132 is the output of the digital phase locked loop (DPLL) 1102, $\Delta x$ 1172a-b is the modulation data, $k_u$ 1150 is the high-pass gain, $K_v$ 1173 is the total gain of the digital-to-analog converter (DAC) and the voltage-controlled oscillator (VCO), $f_{ref}$ 1110 is the sampling clock (i.e., the reference frequency 1110), n is the bit-width resolution of the sigma-delta modulator, $N_0$ is the division ratio of the pre-scaler, and h(s) 1171 is the transfer function of the feed-forward path before the voltage-controlled oscillator (VCO). Since Equation (4) is an all-pass transfer function, Equation (5) logically follows:

$$k_u K_v \frac{2^n}{f_{ref}} = 1 \Rightarrow k_u = \frac{f_{ref}}{2^n K_v} \quad (5)$$

Instead of applying the low-pass modulation data ($\Delta x$ 1172a) after the phase-to-digital converter (PDC) 934, it may be input into the sigma-delta modulator 1140 on the feedback path. The high-pass gain ($k_u$) 950 is only a function of the reference frequency 910a-b, voltage-mode DAC 968 and the analog voltage controlled oscillator (VCO) 928 gain and the resolution of the sigma-delta modulator. It may be independent of the channel selected and phase-to-digital converter (PDC) 934 gain. Therefore, there is no need to calibrate the phase-to-digital converter (PDC) 934 gain and update ($k_u$) 950 according to the channel selected. Another advantage of applying the low-pass modulation data ($\Delta x$ 1172a) to the feedback path is the relatively small phase variations induced at the phase-to-digital converter (PDC) 934 input. This also implies a less stringent requirement on the phase-to-digital converter (PDC) 934 input dynamic range.

Figure 12:
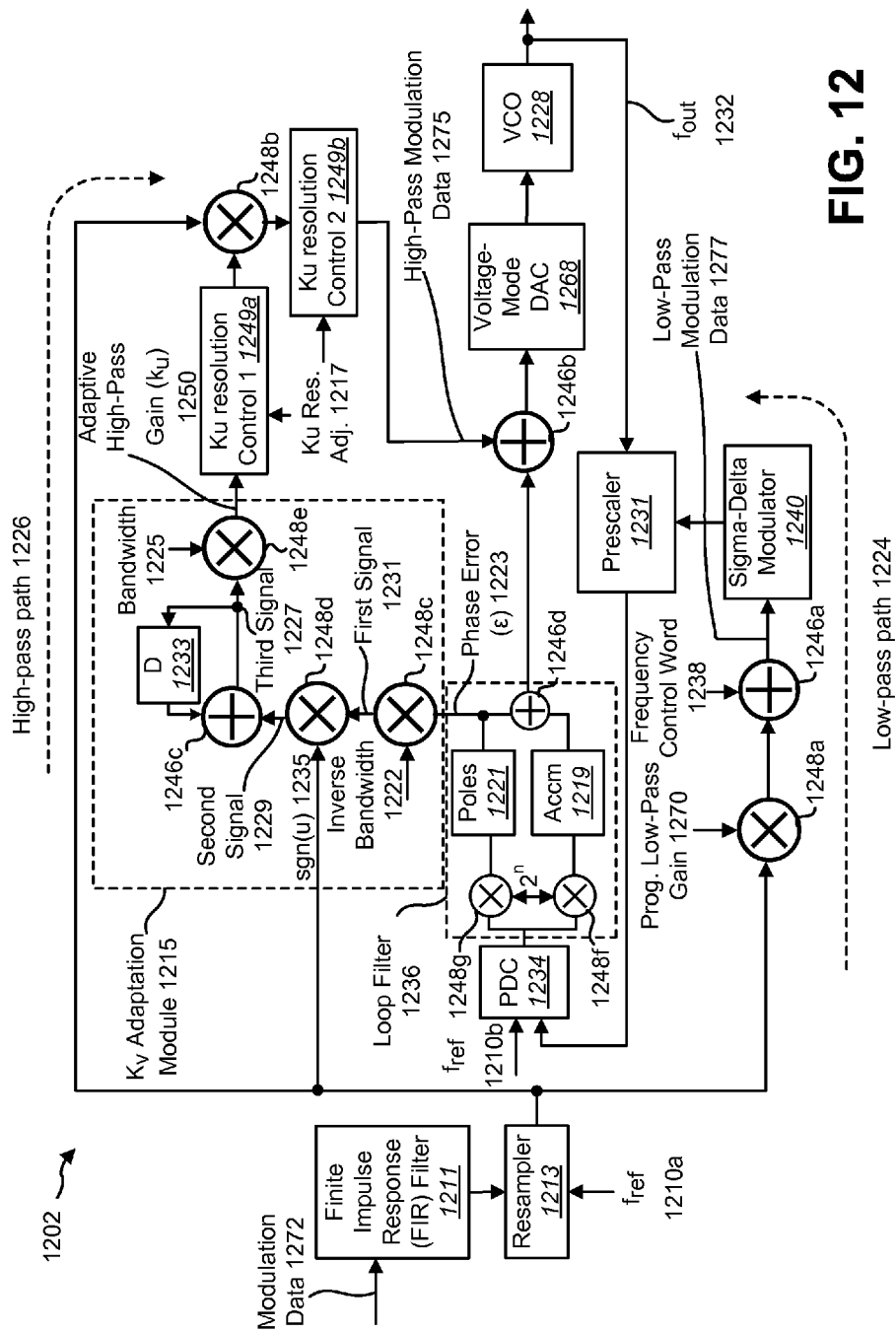
FIG. 12 is a block diagram illustrating another configuration of a two point modulation digital phase locked loop (DPLL)

FIG. 12 is a block diagram illustrating another configuration of a two point modulation digital phase locked loop (DPLL) 1202. For example, the DPLL 1202 may be implemented as an integrated circuit. The two point modulation digital phase locked loop (DPLL) 1202 may have similar functionality as the digital phase locked loop (DPLL) 902 illustrated in FIG. 9, but with the $k_v$ adaptation module 1215 and the loop filter 1236 illustrated in more detail. The $k_v$ adaptation module 1215 is illustrated with a first signal 1231, a second signal 1229 and a third signal 1227, however, the description of these signals will be discussed below.

Therefore, the two point modulation digital phase locked loop (DPLL) 1202 may include a phase-to-digital converter (PDC) 1234, a loop filter 1236, a voltage-mode digital-to-analog converter (VDAC) 1268, an analog voltage controlled oscillator (VCO) 1228, a prescaler 1231, a sigma-delta modulator 1240, finite impulse response (FIR) filter 1211, resampler 1213 and multiple adders 1246a-d and digital multipliers 1248a-g that include similar functionality as the phase-to-digital converter (PDC) 934, loop filter 936, voltage-mode digital-to-analog converter (VDAC) 968, analog voltage controlled oscillator (VCO) 928, prescaler 931, sigma-delta modulator 940, finite impulse response (FIR) 911, resampler 913, adders 946a-b and digital multipliers 948a-c in FIG. 9, respectively.

Additionally, in FIG. 12, the digital loop filter 1236 is illustrated in more detail as having multipliers 1248a-b, an adder 1246a, poles 1221 and an accumulator 1219. More specifically, the digital loop filter 1236 may be a two-path, multi-order filter. It has an accumulator 1219 on one path and multiple cascaded, single-stage IIR filters on the other path. By using an adder 1246d to combine these two paths, a zero and multiple poles are created to filter the output of the phase-to-digital converter (PDC) 1234.

As before, low-pass modulation data 1277 (i.e., modulation data 1272 scaled by the low-pass gain 1270 and summed with a frequency control word 1238) may be received by the sigma-delta modulator 1240. Furthermore, high-pass modulation data 1275 (i.e., modulation data 1272 that has been scaled by $k_u$ 1250 and a programmable $k_u$ resolution adjustment 1217) may be injected at the input of a voltage-mode digital-to-analog converter (VDAC) 1268. As before, the voltage-mode digital-to-analog converter (VDAC) 1268 may control the voltage controlled oscillator (VCO) 1228 to produce an output frequency ($f_{out}$) 1232. In order to enhance the performance of the two point modulation digital phase locked loop (DPLL) 1202, four techniques, among others, may be used. First, a switchable sampling clock may be used. Second, a programmable high-pass gain ($k_u$) resolution 1217 may be used to compensate for different sampling clock frequencies. Third, a filtered phase error ($\epsilon$) 1223 may be used as input for the $k_v$ adaptation module 1215 input. Fourth, the kv adaptation module 1215 may operate with high precision.

First, a switchable sampling clock may be used in the digital phase locked loop (DPLL) 1202. The reference clock 1210a-b in the digital phase locked loop (DPLL) 1202 may be used as the sampling clock. In a digital phase locked loop (DPLL) 1202, a low-frequency sampling clock may be preferred because it may consume less dynamic power and have weaker spur coupling through the substrate. Yet, the same low-frequency sampling clock cannot be used for all near-integer channels due to fractional spurs, which degrade the noise and output radio frequency spectrum variations (ORFS) performance of a digital phase locked loop (DPLL) 1202. One possible solution is to switch the reference frequency 1210a-b of the digital phase locked loop (DPLL) 1202 to push the fractional spurs away so that the out-of-band attenuation of the digital phase locked loop (DPLL) 1202 can suppress them. In other words, the digital phase locked loop (DPLL) 1202 may be switched to other sampling clocks to reduce fractional spurs when near-integer channels are selected. By the use of reference frequency switching, power consumption and the spurious performance of the two point modulation digital phase locked loop (DPLL) 1202 may be achieved.

The high-pass gain ($k_u$) 1250 for a well-matched two point modulation system may change with the reference frequency 1210a-b, as shown in Equation (5). In order to minimize phase error ($\epsilon$) 1223 and output radio frequency spectrum variations (ORFS) degradation, the correct high-pass gain ($k_u$) 1250, determined by Kv adaptation, may be used with reference frequency 1210a-b switching. Kv may be the total gain contributed by the VDAC 1268 and the VCO 1228 as shown in Equation (5). According to Equation (5), $k_u$ 1250 changes when Kv (and fief 1210a-b) are adjusted. Kv adaptation, therefore, may be used to determine the value of $k_u$ 1250 according to Kv (or the total gain of the VDAC 1268 and the VCO 1228). Possible values of $k_u$ 1250 as a function of $f_{ref}$ 1210a-b (with a constant Kv) are shown in Table 1.

TABLE 1

Example $k_u$ values for different reference frequencies with the same $k_v$

| | $f_{ref}$(MHz) | | | | |
|---|---|---|---|---|---|
| | 1 × 19.2 | 1.5 × 19.2 | 2 × 19.2 | 3 × 19.2 | 3.5 × 19.2 | 4 × 19.2 |
| $k_u$ | 1.2797 | 1.9195 | 2.559 | 3.8391 | 4.4789 | 5.1188 |

Second, the decrease in the values of $k_u$ 1250 with $f_{ref}$ 1210*a-b* calls for an increase in the precision of $k_u$ 1250 with low reference frequencies 1210*a-b*, i.e., the lowest sampling clock may use the highest resolution. This more precise $k_u$ 1250 may reduce the quantization noise and, ultimately, the impact of gain mismatch between the high-pass path 1226 and low-pass path 1224, i.e., gain matching of the high-pass path 1226 and low-pass path 1224 may be improved by higher resolution. Yet, if the resolution of $k_u$ 1250 is too large, the chip area and the settling time required for the $k_v$ adaptation 1215 may be unnecessarily increased. Therefore, the present systems and methods may find the optimal and highest resolution required for the lowest sampling clock and program the $k_u$ resolution adjustment 1217 for the other sampling clocks. As shown in FIG. 12, by adding a first programmable $k_u$ resolution control 1249*a* before the multiplier 1248*b* output for $k_u$ 1250 and the modulation data 1272, the resolution of the product of the high-pass gain ($k_u$) 1250 and the modulation data 1272 may be altered based on the reference frequency 1210*a-b*. In order to keep the gain of the high-pass path 1226 unchanged, a second $k_u$ resolution control 1249*b* may be used to restore the overall gain. The first $k_u$ resolution control 1249*a* and second resolution control 1249*b* may be controlled by a $k_u$ resolution adjustment 1217. The first $k_u$ resolution control 1249*a* and second resolution control 1249*b* may be implemented by signed right-shift and left-shift operators.

Third, a filtered phase error ($\epsilon$) 1223, instead of the phase-to-digital converter (PDC) 1234 output directly, may be used as input for the $k_v$ adaptation module 1215. In this way, the phase-to-digital converter (PDC) 1234 output may be scaled up by $2^n$ in the loop filter 1236 so the resolution of the phase error ($\epsilon$) 1223 may be enhanced by n times. Additionally, noise in the phase error ($\epsilon$) 1223 may be filtered out by the poles 1221. In order to avoid a direct current (DC) offset before accumulation in the $k_v$ adaptation module 1215, the phase error ($\epsilon$) 1223 may be obtained after the poles 1221 in the two-path loop filter 1236 instead of the merged outputs with the accumulator 1219 in the loop filter 1236.

The received filtered phase error ($\epsilon$) 1223 may be multiplied by an inverse bandwidth coefficient (1/$\gamma$) 1222 and the sign bit of the phase error ($\epsilon$) 1223 to produce a second signal 1229 (i.e., sgn(u)·$\epsilon$/$\gamma$). In one configuration, only the sign bit of u 1235 is used to simplify its multiplication with $\epsilon$ 1223 into a simple multiplexer (MUX). In this configuration, only $\epsilon$ 1223 and its two's complement are needed as the inputs of the MUX.

Fourth, a bandwidth coefficient ($\gamma$) 1225 may be used in the $k_v$ adaptation module 1215 to multiply the accumulator output (i.e., the third signal 1227) where the accumulator includes a delay element 1233 and an adder 1246*c*. Since $\gamma$ 1225 may be much smaller than 1, any multiplication with $\gamma$ 1225 is equivalent to bit truncation and limits the output precision. Multiplication with $\gamma$ 1225 at the later stage helps to preserve the accuracy of the internal variables. As a result, the algorithm for $k_v$ adaptation may be rewritten according to Equation (6):

$$k_u[n] = \gamma \cdot \{k_{u,tmp}[n-1]/\gamma + \text{sgn}(u[n-1]) \cdot \epsilon[n-1]\} \quad (6)$$

where sgn( ) is the sign bit, or most significant bit, of the input data, and $k_{u,tmp}$ is the third signal 1227 (i.e., the output of the accumulator). Adjusting the sequence of the multiplication of the bandwidth coefficient ($\gamma$) 1225 to the accumulator output of the $k_v$ adaptation module 1215 may preserve the precision of the internal variables. The multiplication with an inverse bandwidth coefficient (1/$\gamma$) 1222 and the bandwidth coefficient ($\gamma$) 1225 may be implemented by left-shift and right-shift operations, i.e., the multipliers 1248*c*, 1248*e*.

Figure 13:
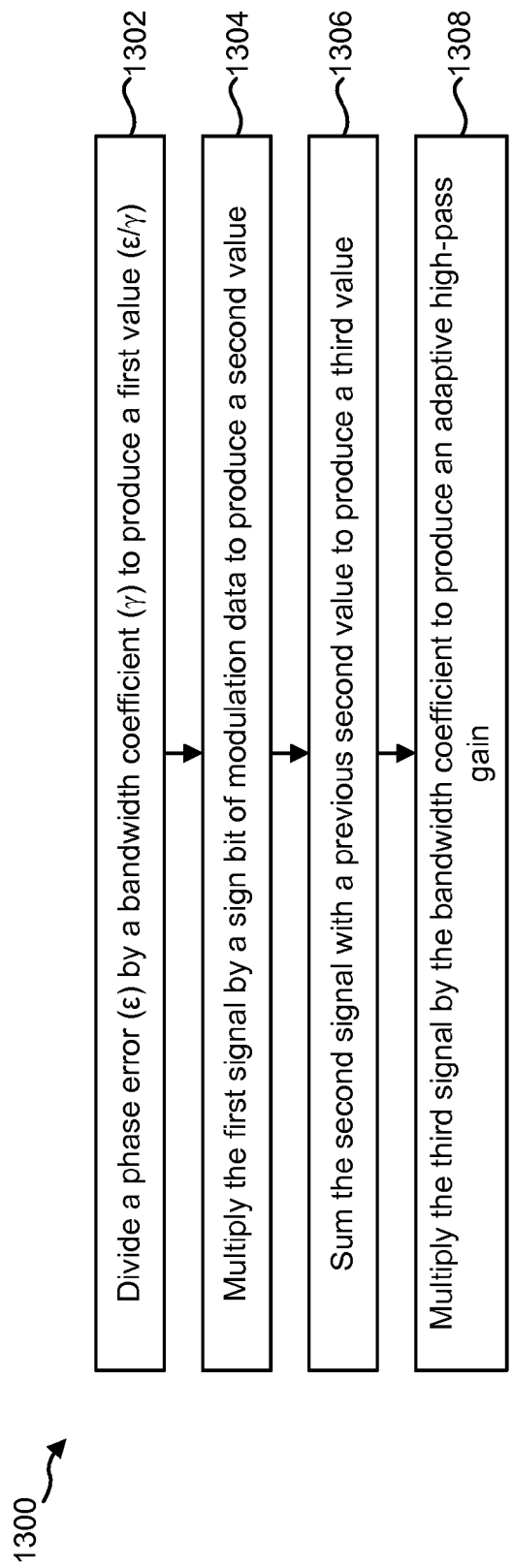
FIG. 13 is a flow diagram illustrating a method for $k_v$ adaptation.

FIG. 13 is a flow diagram illustrating a method 1300 for $k_v$ adaptation. The method 1300 may be performed by a $k_v$ adaptation module 1215 in a two point modulation digital phase locked loop (DPLL) 1202. The $k_v$ adaptation module 1215 may divide 1302 a phase error ($\epsilon$) 1223 by a bandwidth coefficient ($\gamma$) 1225 (i.e., multiply by the inverse bandwidth 1222) to produce a first signal ($\epsilon$/$\gamma$) 1231. The $k_v$ adaptation module 1215 may also multiply 1304 the first signal 1231 by a sign bit of modulation data (i.e., sgn(u) 1235) to produce a second signal 1229 (i.e., sgn(u)·$\epsilon$/$\gamma$). The $k_v$ adaptation module 1215 may also sum 1306 the second signal 1229 with a previous second signal to produce a third signal 1227 (i.e., $k_{u,tmp}$). The $k_v$ adaptation module 1215 may also multiply 1308 the third signal 1227 by the bandwidth coefficient ($\gamma$) 1225 to produce an adaptive high-pass gain 1250.

Figure 14:
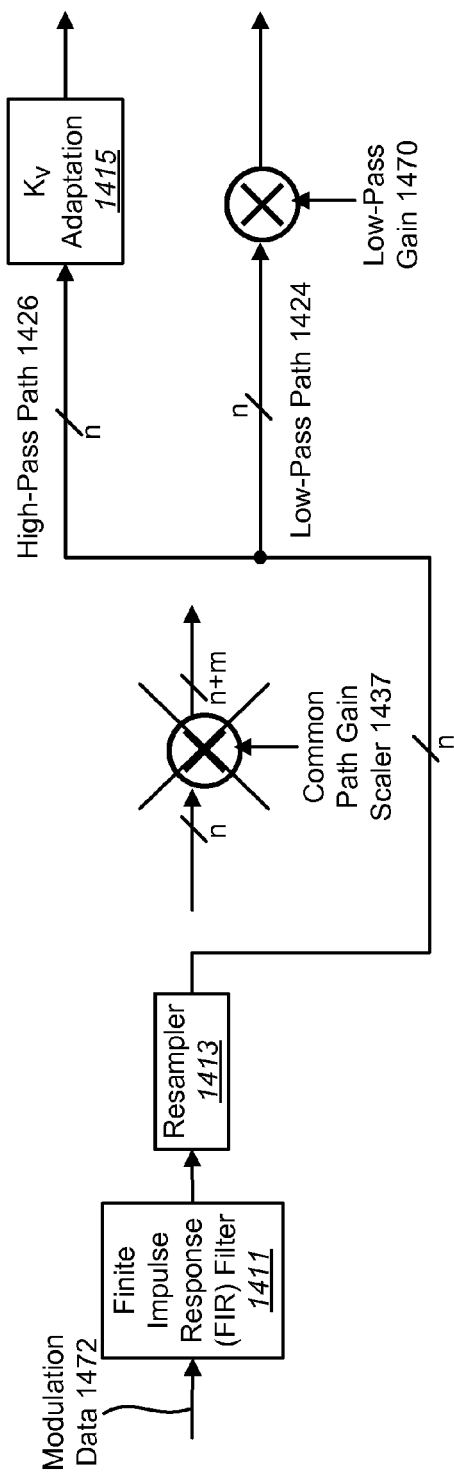
FIG. 14 is a block diagram illustrating gain scaling for a sigma-delta modulator.

FIG. 14 is a block diagram illustrating gain scaling for a sigma-delta modulator 1240. Besides the multiplication simplification in the $k_v$ adaptation module 1415 by only using the sign-bit of $\epsilon$ 1223, the high-pass path 1426 and low-pass path 1424 may also be simplified to implement an area-efficient two point modulation digital phase locked loop (DPLL) 1202.

Common path gain scaling, using a common path gain scaler 1437, may be done on the input data 1472 in the common path of the high-pass path 1426 and the low-pass path 1424 after the finite impulse response (FIR) filter 1411 and the resampler 1413 to make sure the phase deviation represented by each bit is the same after being processed by the sigma-delta modulator 1240, prescaler, DAC and VCO. Yet, scaling the gain (usually by more than one) instantly after the resampler 1413 may increase the bit-width of the data going into the high-pass path 1426 and low-pass path 1424.

In order to reduce the number of bits, the common path gain scaler 1437 may be removed and the gain scaling for the high-pass path 1426 and low-pass path 1424 may be done separately. Therefore, a low-pass gain 1470 may be applied in the low-pass path 1424 only before the sigma-delta modulator adder 1246*a*. This low-pass gain 1470 may be programmable for different sampling clocks. The output resolution of the low-pass path 1426 may be dependent on the resolution of the input data after the FIR 1411 and resampler 1413, the prescaler and the sigma-delta modulator. As mentioned before, it may be beneficial for the phase deviation represented by each bit to be the same after being processed by the sigma-delta modulator. For different sampling clocks, the resolution at the resampler output may be different. Thus, the low-pass gain may be programmed accordingly. In the high-pass path 1426, no specific gain scaling may be needed because the high-pass path 1426 gain scaling may be intrinsically achieved through the $k_v$ adaptation module 1415. In the $k_v$ adaptation path, since only the sign bit of the input data is used, only a single bit, the most significant bit, may be input into the $k_v$ adaptation module 1415. This may minimize the bit-width of data buses and chip area of the two point modulation digital phase locked loop (DPLL) 1202, especially when delay matching circuitry for each path is included, e.g., the bit-widths of the modulation data 1472 may no longer be doubled when the data is split into two and the number of flip-flops, routing connections and the overall chip area may be reduced.

Figure 15:
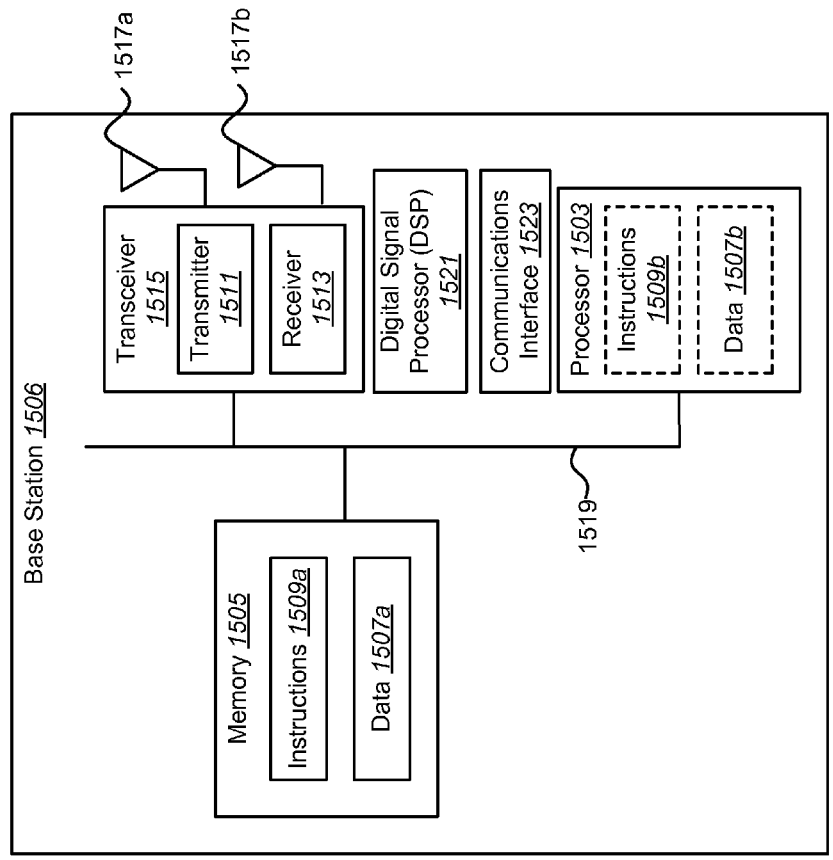
FIG. 15 illustrates certain components that may be included within a base station.

FIG. 15 illustrates certain components that may be included within a base station 1506. A base station 1506 may also be referred to as, and may include some or all of the functionality of, an access point, a broadcast transmitter, a node B, an evolved node B, etc. For example, the base station 1506 may include the transmitter 100 illustrated in FIG. 1. The base station 1506 includes a processor 1503. The processor 1503 may be a general purpose single- or multi-chip microprocessor (e.g., an ARM), a special purpose microprocessor (e.g., a digital signal processor (DSP)), a microcontroller, a programmable gate array, etc. The processor 1503 may be referred to as a central processing unit (CPU). Although just a single processor 1503 is shown in the base station 1506 of FIG. 15, in an alternative configuration, a combination of processors (e.g., an ARM and DSP) could be used.

The base station 1506 also includes memory 1505. The memory 1505 may be any electronic component capable of storing electronic information. The memory 1505 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1507a and instructions 1509a may be stored in the memory 1505. The instructions 1509a may be executable by the processor 1503 to implement the methods disclosed herein. Executing the instructions 1509a may involve the use of the data 1507a that is stored in the memory 1505. When the processor 1503 executes the instructions 1509a, various portions of the instructions 1509b may be loaded onto the processor 1503, and various pieces of data 1507b may be loaded onto the processor 1503.

The base station 1506 may also include a transmitter 1511 and a receiver 1513 to allow transmission and reception of signals to and from the base station 1506. The transmitter 1511 and receiver 1513 may be collectively referred to as a transceiver 1515. Multiple antennas 1517a-b may be electrically coupled to the transceiver 1515. The base station 1506 may also include (not shown) multiple transmitters, multiple receivers, multiple transceivers and/or additional antennas.

The base station 1506 may include a digital signal processor (DSP) 1521. The base station 1506 may also include a communications interface 1523. The communications interface 1523 may allow a user to interact with the base station 1506.

The various components of the base station 1506 may be coupled together by one or more buses, which may include a power bus, a control signal bus, a status signal bus, a data bus, etc. For the sake of clarity, the various buses are illustrated in FIG. 15 as a bus system 1519.

Figure 16:
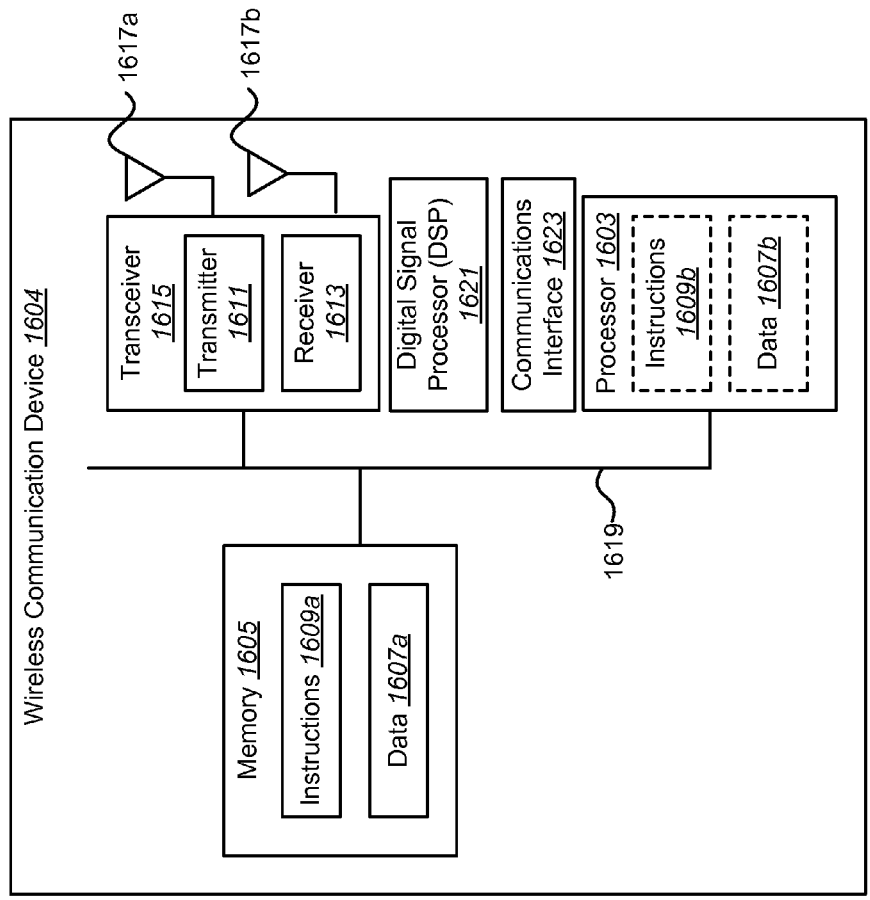
FIG. 16 illustrates certain components that may be included within a wireless communication device.

FIG. 16 illustrates certain components that may be included within a wireless communication device 1604. The wireless communication device 1604 may be an access terminal, a mobile station, a user equipment (UE), etc. For example, the wireless communication device 1604 may include the transmitter 100 illustrated in FIG. 1. The wireless communication device 1604 includes a processor 1603. The processor 1603 may be a general purpose single- or multi-chip microprocessor (e.g., an ARM), a special purpose microprocessor (e.g., a digital signal processor (DSP)), a microcontroller, a programmable gate array, etc. The processor 1603 may be referred to as a central processing unit (CPU). Although just a single processor 1603 is shown in the wireless communication device 1604 of FIG. 16, in an alternative configuration, a combination of processors (e.g., an ARM and DSP) could be used.

The wireless communication device 1604 also includes memory 1605. The memory 1605 may be any electronic component capable of storing electronic information. The memory 1605 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1607a and instructions 1609a may be stored in the memory 1605. The instructions 1609a may be executable by the processor 1603 to implement the methods disclosed herein. Executing the instructions 1609a may involve the use of the data 1607a that is stored in the memory 1605. When the processor 1603 executes the instructions 1609a, various portions of the instructions 1609b may be loaded onto the processor 1603, and various pieces of data 1607b may be loaded onto the processor 1603.

The wireless communication device 1604 may also include a transmitter 1611 and a receiver 1613 to allow transmission and reception of signals to and from the wireless communication device 1604. The transmitter 1611 and receiver 1613 may be collectively referred to as a transceiver 1615. Multiple antennas 1617a-b may be electrically coupled to the transceiver 1615. The wireless communication device 1604 may also include (not shown) multiple transmitters, multiple receivers, multiple transceivers and/or additional antennas.

The wireless communication device 1604 may include a digital signal processor (DSP) 1621. The wireless communication device 1604 may also include a communications interface 1623. The communications interface 1623 may allow a user to interact with the wireless communication device 1604.

The various components of the wireless communication device 1604 may be coupled together by one or more buses, which may include a power bus, a control signal bus, a status signal bus, a data bus, etc. For the sake of clarity, the various buses are illustrated in FIG. 16 as a bus system 1619.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 6 and 13, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A two point modulation digital phase locked loop circuit, comprising:
    a sampling clock input that is switchable between a plurality of frequencies;
    a sigma-delta modulator in a feedback path that receives low-pass modulation data;
    a voltage-mode digital-to-analog converter (VDAC) that receives high-pass modulation data, wherein a gain applied to at least one of the low-pass modulation data and the high-pass modulation data is based on a frequency of the sampling clock;
    an analog voltage controlled oscillator coupled to the feedback path and the output of the VDAC; and
    a phase-to-digital converter (PDC) coupled to the feedback path, the sampling clock and a loop filter.

2. The two point modulation digital phase locked loop circuit of claim 1, wherein the high-pass modulation data comprises modulation data that is scaled with an adaptive high-pass gain and a high-pass gain resolution adjustment.

3. The two point modulation digital phase locked loop circuit of claim 1, wherein the low-pass modulation data comprises modulation data that is scaled with a variable low-pass gain that is based on the sampling clock frequency and summed with a frequency control word for the sigma-delta modulator.

4. The two point modulation digital phase locked loop circuit of claim 2, further comprising a $K_v$ adaptation module configured to determine the adaptive high-pass gain.

5. The two point modulation digital phase locked loop circuit of claim 4, wherein the $K_v$ adaptation module is further configured to receive a phase error between the sampling clock and the feedback path that has been filtered by the loop filter.

6. The two point modulation digital phase locked loop circuit of claim 5, wherein the $K_v$ adaptation module is further configured to multiply the filtered phase error by an inverse bandwidth coefficient to produce a first signal, to multiply the first signal by a sign bit of the modulation data to produce a second signal, to sum the second signal with a previous second signal to produce a third signal and to multiply the third signal by a bandwidth coefficient to produce the high-pass gain.

7. The two point modulation digital phase locked loop circuit of claim 1, wherein all digital modules in the digital phase locked loop use the sampling clock input as an operation clock.

8. The two point modulation digital phase locked loop circuit of claim 7, wherein the digital modules comprise the sigma-delta modulator, the phase-to-digital converter and the loop filter.

9. The two point modulation digital phase locked loop circuit of claim 1, wherein the high-pass modulation data is summed with the output of the loop filter before it is input to the voltage-mode digital-to-analog converter (VDAC).

10. The two point modulation digital phase locked loop circuit of claim 1, wherein the voltage-mode digital-to-analog converter (VDAC) is configured to receive high-pass modulation data for two-point modulation and to receive output from the loop filter for phase locking.

11. An integrated circuit for two point modulation using a digital phase locked loop, comprising:
 a sampling clock input that is switchable between a plurality of frequencies;
 a sigma-delta modulator in a feedback path that receives low-pass modulation data;
 a voltage-mode digital-to-analog converter (VDAC) that receives high-pass modulation data, wherein a gain applied to at least one of the low-pass modulation data and the high-pass modulation data is based on a frequency of the sampling clock;
 an analog voltage controlled oscillator coupled to the feedback path and the output of the VDAC; and
 a phase-to-digital converter (PDC) coupled to the feedback path, the sampling clock and a loop filter.

12. The integrated circuit of claim 11, wherein the high-pass modulation data comprises modulation data that is scaled with an adaptive high-pass gain and a high-pass gain resolution adjustment.

13. The integrated circuit of claim 11, wherein the low-pass modulation data comprises modulation data that is scaled with a variable low-pass gain that is based on the sampling clock frequency and summed with a frequency control word for the sigma-delta modulator.

14. The integrated circuit of claim 12, further comprising a $K_v$ adaptation module configured to determine the adaptive high-pass gain.

15. The integrated circuit of claim 14, wherein the $K_v$ adaptation module is further configured to receive a phase error between the sampling clock and the feedback path that has been filtered by the loop filter.

16. The integrated circuit of claim 15, wherein the $K_v$ adaptation module is further configured to multiply the filtered phase error by an inverse bandwidth coefficient to produce a first signal, to multiply the first signal by a sign bit of the modulation data to produce a second signal, to sum the second signal with a previous second signal to produce a third signal and to multiply the third signal by a bandwidth coefficient to produce the high-pass gain.

17. The integrated circuit of claim 11, wherein all digital modules in the digital phase locked loop use the sampling clock input as an operation clock.

18. The integrated circuit of claim 17, wherein the digital modules comprise the sigma-delta modulator, the phase-to-digital converter and the loop filter.

19. The integrated circuit of claim 11, wherein the high-pass modulation data is summed with the output of the loop filter before it is input to the voltage-mode digital-to-analog converter (VDAC).

20. The integrated circuit of claim 11, wherein the voltage-mode digital-to-analog converter (VDAC) is configured to receive high-pass modulation data for two-point modulation and to receive output from the loop filter for phase locking.

21. A two point modulation digital phase locked loop circuit, comprising:
 means for receiving a sampling clock that is switchable between a plurality of frequencies;
 means for modulating coupled to a feedback path that receives low-pass modulation data;
 means for converting a digital signal to an analog signal that receives high-pass modulation data;
 means for applying a gain to at least one of the low-pass modulation data and the high-pass modulation data based on a frequency of the sampling clock;
 means for producing an oscillation frequency based on a received analog input signal coupled to the feedback path and the output of the means for converting; and
 means for determining a phase difference between feedback path signal and the sampling clock coupled to a loop filter.

22. The two point modulation digital phase locked loop circuit of claim 21, wherein the high-pass modulation data comprises modulation data that is scaled with an adaptive high-pass gain and a high-pass gain resolution adjustment.

23. The two point modulation digital phase locked loop circuit of claim 21, wherein the low-pass modulation data comprises modulation data that is scaled with a variable low-pass gain that is based on the sampling clock frequency and summed with a frequency control word for the means for modulating.

24. The two point modulation digital phase locked loop circuit of claim 22, further comprising a means for determining the adaptive high-pass gain.

25. The two point modulation digital phase locked loop circuit of claim 24, wherein the means for determining the adaptive high-pass gain comprises means for receiving a phase error between the sampling clock and the feedback path that has been filtered by the loop filter.

26. The two point modulation digital phase locked loop circuit of claim 25, wherein the means for determining the adaptive high-pass gain further comprises:
 means for multiplying the filtered phase error by an inverse bandwidth coefficient to produce a first signal;
 means for multiplying the first signal by a sign bit of the modulation data to produce a second signal;
 means for summing the second signal with a previous second signal to produce a third signal; and
 means for multiplying the third signal by a bandwidth coefficient to produce the high-pass gain.

27. A method for two point modulation, comprising:
 receiving a sampling clock input;
 providing low-pass modulation data to a sigma-delta modulator;
 pre-scaling an analog voltage controlled oscillator (VCO) output based on an output of the sigma-delta modulator;
 determining a phase difference between the sampling clock input and the pre-scaled VCO output;
 summing high-pass modulation data with the phase difference, after filtering, to produce a digital VCO control word;
 applying a gain to at least one of the low-pass modulation data and the high-pass modulation data based on a frequency of the sampling clock input;
 converting the digital VCO control word to an analog control word; and
 providing the analog control word to the analog VCO.

28. The method of claim 27, further comprising scaling received modulation data using an adaptive high-pass gain and a high-pass gain resolution adjustment to produce the high-pass modulation data.

29. The method of claim 27, further comprising:
scaling received modulation data with a variable low-pass gain that is based on the sampling clock frequency; and
summing the low-pass gain-scaled modulation data with a frequency control word for the sigma-delta modulator to produce the low-pass modulation data.

30. The method of claim 28, further comprising determining the adaptive high-pass gain.

31. The method of claim 30, wherein the determining the adaptive high-pass gain comprises receiving a phase error between the sampling clock and the feedback path that has been filtered by the loop filter.

32. The method of claim 31, wherein the determining the adaptive high-pass gain further comprises:
multiplying the filtered phase error by an inverse bandwidth coefficient to produce a first signal;
multiplying the first signal by a sign bit of the modulation data to produce a second signal;
summing the second signal with a previous second signal to produce a third signal; and
multiplying the third signal by a bandwidth coefficient to produce the high-pass gain.

33. A computer-program product for two point modulation using a digital phase locked loop, the computer-program product comprising a non-transitory computer-readable medium having instructions thereon, the instructions comprising:
code for causing a wireless device to receive a sampling clock input;
code for causing a wireless device to provide low-pass modulation data to a sigma-delta modulator;
code for causing a wireless device to pre-scale an analog voltage controlled oscillator (VCO) output based on an output of the sigma-delta modulator;
code for causing a wireless device to determine a phase difference between the sampling clock input and the pre-scaled VCO output;
code for causing a wireless device to sum high-pass modulation data with the phase difference, after filtering, to produce a digital VCO control word;
code for causing the wireless device to apply a gain to at least one of the low-pass modulation data and the high-pass modulation data based on a frequency of the sampling clock input;
code for causing a wireless device to convert the digital VCO control word to an analog control word; and
code for causing a wireless device to provide the analog control word to the analog VCO.

34. The computer-program product of claim 33, further comprising code for causing a wireless device to scale received modulation data using an adaptive high-pass gain and a high-pass gain resolution adjustment to produce the high-pass modulation data.

35. The computer-program product of claim 33, further comprising:
code for causing a wireless device to scale received modulation data with a variable low-pass gain that is based on the sampling clock frequency; and
code for causing a wireless device to sum the low-pass gain-scaled modulation data with a frequency control word for the sigma-delta modulator to produce the low-pass modulation data.

36. The computer-program product of claim 34, further comprising code for causing a wireless device to determine the adaptive high-pass gain.

37. The computer-program product of claim 36, wherein the code for causing a wireless device to determine the adaptive high-pass gain comprises code for causing a wireless device to receive a phase error between the sampling clock and the feedback path that has been filtered by the loop filter.

38. The computer-program product of claim 37, wherein the code for causing a wireless device to determining the adaptive high-pass gain further comprises:
code for causing a wireless device to multiply the filtered phase error by an inverse bandwidth coefficient to produce a first signal;
code for causing a wireless device to multiply the first signal by a sign bit of the modulation data to produce a second signal;
code for causing a wireless device to sum the second signal with a previous second signal to produce a third signal; and
code for causing a wireless device to multiply the third signal by a bandwidth coefficient to produce the high-pass gain.

* * * * *